US012635178B2

(12) United States Patent
Moriya

(10) Patent No.: US 12,635,178 B2
(45) Date of Patent: May 19, 2026

(54) SILICON CARBIDE SEMICONDUCTOR DEVICE

(71) Applicant: FUJI ELECTRIC CO., LTD., Kawasaki (JP)

(72) Inventor: Tomohiro Moriya, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 434 days.

(21) Appl. No.: 18/475,675

(22) Filed: Sep. 27, 2023

(65) Prior Publication Data

US 2024/0021723 A1     Jan. 18, 2024

Related U.S. Application Data

(63) Continuation of application No. PCT/JP2022/032127, filed on Aug. 25, 2022.

(30) Foreign Application Priority Data

Oct. 14, 2021     (JP) ................................. 2021-168523

(51) Int. Cl.
*H10D 30/66*         (2025.01)
*H10D 12/01*         (2025.01)
              (Continued)

(52) U.S. Cl.
CPC ......... *H10D 30/665* (2025.01); *H10D 12/031* (2025.01); *H10D 30/668* (2025.01);
              (Continued)

(58) Field of Classification Search
CPC ............. H10D 12/031; H10D 30/0297; H10D 30/662; H10D 30/665; H10D 30/668;
              (Continued)

(56) References Cited

U.S. PATENT DOCUMENTS

2009/0008708 A1*  1/2009  Arai ................... H10D 30/0297
                                              438/270
2010/0224909 A1*  9/2010  Oohara ................ H10D 30/665
                                              257/E29.198
(Continued)

FOREIGN PATENT DOCUMENTS

CN        110569686 B  *  8/2022  ........... G06K 9/0004
JP        2017-005278 A    1/2017
              (Continued)

OTHER PUBLICATIONS

Office Action of German Patent Application No. 11 2022 000 969.1 dated Aug. 8, 2025.

(Continued)

*Primary Examiner* — Nelson Garces
(74) *Attorney, Agent, or Firm* — Rabin & Berdo, P.C.

(57)     ABSTRACT

In an intermediate region between an active region and an edge termination region, on a front surface of a semiconductor substrate, a gate polysilicon wiring layer is provided via an insulating layer in which a gate insulating film and a field oxide film are stacked sequentially. An inner peripheral end of the field oxide film is positioned directly beneath the gate polysilicon wiring layer, which extends inward from the field oxide film and terminates on the gate insulating film. At the surface of the insulating layer directly beneath the gate polysilicon wiring layer, on the inner peripheral end of the field oxide film, a drop is formed by a difference in thickness due to whether the field oxide film is present. A distance from the drop to a contact hole of the active region is 21 µm or less.

5 Claims, 14 Drawing Sheets

(51) Int. Cl.
    *H10D 62/10*         (2025.01)
    *H10D 62/832*       (2025.01)

(52) U.S. Cl.
    CPC ......... *H10D 62/107* (2025.01); *H10D 62/111* (2025.01); *H10D 62/127* (2025.01); *H10D 62/8325* (2025.01)

(58) Field of Classification Search
    CPC .. H10D 62/104; H10D 62/106; H10D 62/107; H10D 62/111; H10D 62/112; H10D 62/127; H10D 62/157; H10D 62/8325; H10D 62/393; H10D 84/141
    See application file for complete search history.

(56) References Cited

U.S. PATENT DOCUMENTS

| | | |
|---|---|---|
| 2011/0284874 A1 | 11/2011 | Miura et al. |
| 2013/0020587 A1 | 1/2013 | Hino et al. |
| 2016/0276443 A1 | 9/2016 | Kono |
| 2018/0350900 A1 | 12/2018 | Nakamata et al. |
| 2019/0140084 A1 | 5/2019 | Shirakawa et al. |
| 2019/0371936 A1 | 12/2019 | Nagahisa et al. |
| 2020/0328301 A1* | 10/2020 | Araoka ............. H10D 62/8325 |
| 2021/0074845 A1* | 3/2021 | Hoshi ..................... H01L 23/49 |
| 2021/0074846 A1* | 3/2021 | Hoshi ............... H10D 62/8325 |
| 2021/0226053 A1* | 7/2021 | Hoshi ................. H10D 30/669 |
| 2021/0273117 A1* | 9/2021 | Hoshi ................. H10D 62/834 |

FOREIGN PATENT DOCUMENTS

| | | |
|---|---|---|
| JP | 2018-206873 A | 12/2018 |
| JP | 2019-087730 A | 6/2019 |
| JP | 2020-136539 A | 8/2020 |
| JP | 2020-177955 A | 10/2020 |
| JP | 2020-191420 A | 11/2020 |
| JP | 2021-093496 A | 6/2021 |
| WO | 2018/155566 A1 | 8/2018 |

OTHER PUBLICATIONS

International Search Report for International Application No. PCT/JP2022/032127, issued on Nov. 15, 2022.
Written Opinion for International Application No. PCT/JP2022/032127, issued on Nov. 15, 2022.

* cited by examiner

ACTIVE REGION

INTERMEDIATE REGION+
EDGE TERMINATION REGION

ACTIVE REGION

INTERMEDIATE REGION+
EDGE TERMINATION REGION

FIG.15
RELATED ART

SILICON CARBIDE SEMICONDUCTOR DEVICE

CROSS REFERENCE TO RELATED APPLICATIONS

This is a continuation application of International Application PCT/JP2022/032127 filed on Aug. 25, 2022, which claims priority from Japanese Patent Application No. 2021-168523 filed on Oct. 14, 2021, the entire contents of which are incorporated herein by reference.

BACKGROUND OF THE INVENTION

1. Field of the Invention

Embodiments of the invention relate to a silicon carbide semiconductor device.

2. Description of the Related Art

Metal oxide semiconductor field effect transistors (SiC-MOSFET) having insulated gates with a metal-oxide film-semiconductor three-layer structure are conventionally known silicon carbide semiconductor devices containing silicon carbide (SiC) as a semiconductor material. In a SiC-MOSFET, in an intermediate region between an active region and an edge termination region, a gate insulating film extends on a front surface of a semiconductor substrate, from an active region; and on the gate insulating film, a gate runner is provided via a field oxide film.

A structure of a conventional silicon carbide semiconductor device is described. FIG. 13 is a plan view depicting a portion of a layout when the conventional silicon carbide semiconductor device is viewed from a front side of a semiconductor substrate thereof. FIG. 13 depicts a vicinity of a corner portion (vertex) 201a of an active region 201. FIGS. 14 and 15 are cross-sectional views depicting the structure along cutting line AA-AA' and cutting line BB-BB' in FIG. 13, respectively. A conventional silicon carbide semiconductor device 230 depicted in FIGS. 13 to 15 is a vertical SiC-MOSFET with a trench gate structure that has, on a semiconductor substrate (semiconductor chip) 210 containing silicon carbide, an active region 201 and an edge termination region 202 that surrounds a periphery of the active region 201.

The semiconductor substrate 210 is formed by epitaxially growing, on an $n^+$-type starting substrate 211 containing silicon carbide, epitaxial layers 212, 213 that constitute an $n^-$-type drift region 232 and p-type base regions 234. The semiconductor substrate 210 has, as a front surface, a main surface that has the p-type epitaxial layer 213 and, as a back surface, a main surface that has the $n^+$-type starting substrate 211. In the active region 201, multiple unit cells (constituent units of a device) of the MOSFET, each having the same structure are disposed adjacent to one another. The active region 201 has, in a plan view, a substantially rectangular shape and is provided in substantially a center (chip center) of the semiconductor substrate 210.

The active region 201, in a longitudinal direction (later-described first direction X) of later-described gate trenches 237, is a region further inward (relatively closer to a chip center) than are longitudinal ends of later-described contact holes 240a, 240b. The active region 201, in a lateral direction (later-described second direction Y) of the gate trenches 237, is a region further inward than is an outer (relatively closer to an end (chip end) of the semiconductor substrate 210) sidewall of an outermost contact hole 240b. The longitudinal ends of the contact holes 240a, 240b are side surfaces of an insulating layer (an interlayer insulating film 240 and a gate insulating film 238) and form the sidewalls of the contact holes 240a, 240b, along the longitudinal direction.

In the active region 201, a general trench gate structure is provided in the semiconductor substrate 210, at the front surface of the semiconductor substrate 210. The trench gate structure is configured by the p-type base regions 234, $n^+$-type source regions 235, $p^{++}$-type contact regions 236, the gate trenches 237, the gate insulating film 238, and gate electrodes 239. The gate trenches 237 extend linearly in the first direction X (longitudinal direction) and terminate in the active region 201; the first direction X being parallel to the front surface of the semiconductor substrate 210. The gate trenches 237 are disposed in plural adjacent to one another in the second direction Y (lateral direction), in a striped pattern; the second direction Y being parallel to the front surface of the semiconductor substrate 210 and orthogonal to the first direction X.

The gate trenches 237 are disposed adjacent to one another in the second direction Y, whereby the unit cells each having the same structure are disposed adjacently in the second direction Y. The gate insulating film 238 is provided along inner walls of the gate trenches 237 and extends on the front surface of the semiconductor substrate 210, from the gate trenches 237. On the front surface of the semiconductor substrate 210, the gate insulating film 238 reaches the chip end from the active region 201. The gate electrodes 239 are provided on the gate insulating film 238 in the gate trenches 237 so as to be embedded in the gate trenches 237.

The gate electrodes 239, at longitudinal ends of the gate trenches 237 are connected by a later-described gate poly-silicon (poly-Si) wiring layer 262. The interlayer insulating film 240 is provided on the gate insulating film 238 at the front surface of the semiconductor substrate 210 and spans an entire area of the front surface of the semiconductor substrate 210 so as to cover the gate electrodes 239, the gate polysilicon wiring layer 262, and a field oxide film 261. In the active region 201, the contact holes 240a, 240b that penetrate through the interlayer insulating film 240 and the gate insulating film 238 in a depth direction Z and reach the front surface of the semiconductor substrate 210 are provided.

The contact holes 240a, 240b of the active region 201 extend in a striped pattern in the first direction X. The outermost contact hole 240b of the active region 201 is provided closer to the chip end in the second direction Y than is an outermost one of the gate trenches 237. In an entire area of the outermost contact hole 240b of the active region 201, a later-described $p^{++}$-type contact extension portion 236a is exposed. Other contact holes 240a of the active region 201 are each provided between an adjacent two of the gate trenches 237, expose the $n^+$-type source regions 235 and the $p^{++}$-type contact regions 236, and expose the $p^{++}$-type contact extension portion 236a at ends thereof along the longitudinal direction (the first direction X).

An intermediate region 203 between the active region 201 and the edge termination region 202 is adjacent to the active region 201 and surrounds the periphery of the active region 201 in substantially a rectangular shape. In the intermediate region 203, the $p^{++}$-type contact extension portion 236a is provided in the semiconductor substrate 210, at the front surface of the semiconductor substrate 210 and faces, in the depth direction Z, an entire area of the surface of the later-described gate polysilicon wiring layer 262. The $p^{++}$- type contact extension portion 236a is a portion of the p$^{++}$-type contact regions 236 extending into the intermediate region 203. The p$^{++}$-type contact extension portion 236a is provided in an entire area between the front surface of the semiconductor substrate 210 and a p-type base extension portion 234a.

The p-type base extension portion 234a is a portion of the p-type base regions 234 extending into the intermediate region 203. The p-type base extension portion 234a and the p$^{++}$-type contact extension portion 236a surround the periphery of the active region 201 and extend inward (toward the chip center) to the gate trenches 237. The p$^{++}$-type contact extension portion 236a are exposed in an entire area of the outermost contact hole 240b of the active region 201. Between the p-type base extension portion 234a and the n$^{-}$-type drift region 232, a p$^{+}$-type extension portion 252a is provided. The p$^{+}$-type extension portion 252a is disposed away from the gate trenches 237 and surrounds the periphery of the active region 201.

In the intermediate region 203, the gate polysilicon wiring layer 262 and a gate metal wiring layer 263 constituting the gate runner are sequentially stacked on the gate insulating film 238 at the front surface of the semiconductor substrate 210, via the field oxide film 261. The field oxide film 261 and the gate polysilicon wiring layer 262 are provided between the interlayer insulating film 240 and the gate insulating film 238 on the front surface of the semiconductor substrate 210. An inner end 261a of the field oxide film 261, over the entire periphery of the active region 201, is closer to the chip end than is a border between the active region 201 and the intermediate region 203 (the longitudinal ends of the contact holes 240a, 240b and outer sidewall of the contact hole 240b) and is positioned at a distance w201 of about 32 μm to 54 μm from the border.

As a result, at the inner end 261a of the field oxide film 261, a drop 264 formed at a surface of a later-described insulating layer 260 is apart from the longitudinal ends of the contact holes 240a, 240b of the active region 201 outwardly in the first direction X and directions oblique to the first and second direction X, Y by the distance w201, and is apart from the outer sidewall of the outermost contact hole 240b of the active region 201 outwardly in the second direction Y by the distance w201 described above. The distance w201 from the drop 264 of the surface of the insulating layer 260 to the border between the active region 201 and the intermediate region 203 is greatest in a direction oblique to the first and second directions X, Y at the corner portions 201a of the active region 201.

On the front surface of the semiconductor substrate 210 closer to the chip end than is the active region 201, the insulating layer 260 is disposed having a relatively thick portion formed by the gate insulating film 238 and the field oxide film 261 sequentially stacked in the order stated and a relatively thin portion formed by only the gate insulating film 238 and closer to the chip center than is the relatively thick portion. Due to the difference in thickness of the insulating layer 260, at the surface of the insulating layer 260, the drop 264 that is recessed toward a drain electrode 243 is formed closer to the chip center than is the inner end 261a of the field oxide film 261. The gate polysilicon wiring layer 262 is provided on the field oxide film 261 and surrounds the periphery of the active region 201.

Further, the gate polysilicon wiring layer 262 extends toward the chip center, passing through the drop 264 of the inner end 261a of the field oxide film 261, from on the field oxide film 261, and terminates on the gate insulating film 238 at the front surface of the semiconductor substrate 210 in the intermediate region 203. Thus, a portion of the insulating layer 260 between the front surface of the semiconductor substrate 210 and the gate polysilicon wiring layer 262 is relatively thinner at a portion toward the chip center. The gate metal wiring layer 263 surrounds the periphery of the active region 201. The gate metal wiring layer 263 is in contact with the gate polysilicon wiring layer 262 via a contact hole 240c of the interlayer insulating film 240.

Reference numerals 231, 241, 242, 223, and 224 are an n$^{+}$-type drain region, a source electrode, a passivation film, an n$^{+}$-type channel stopper region, and a p$^{+}$-type region, respectively. Reference numeral 233 is an n-type current spreading region. Reference character 233a is a portion of the n-type current spreading region extending into the intermediate region 203. Reference numerals 251 and 252 are p$^{+}$-type regions for mitigating electric field of the gate insulating film 238 at the bottoms of the gate trenches 237. The p$^{+}$-type extension portion 252a is a portion of a p$^{+}$-type region extending into the intermediate region 203. Reference numerals 221 and 222 are, respectively, p$^{-}$-type regions and p$^{--}$-type regions configuring a voltage withstanding structure 220 of the edge termination region 202.

As a conventional vertical SiC-MOSFET, a device has been proposed in which a p$^{+}$-type region having an impurity concentration that is higher than that of a p-type base region is provided in a corner portion of the active region and displacement current occurring in the edge termination region during a switching transition period from on to off is pulled out from this p$^{+}$-type region to a source electrode (for example, refer to Japanese Laid-Open Patent Publication No. 2018-206873 and Japanese Laid-Open Patent Publication No. 2017-005278). In Japanese Laid-Open Patent Publication No. 2018-206873 and Japanese Laid-Open Patent Publication No. 2017-005278, during the switching transition period from on to off, the displacement current occurring in the edge termination region is pulled out from the p$^{+}$-type region of the corner portion of the active region, whereby in a vicinity of the corner portion of the active region, high electric field applied to the gate insulating film and a field oxide film is suppressed.

Further, as another conventional vertical SiC-MOSFET, a device has been proposed in which excluding a sensing enabled region in which a sensing MOSFET performing current sensing is disposed, a low lifetime region is provided in a region of a main non-operating region through which a main current of a main MOSFET does not flow, (for example, refer to Japanese Laid-Open Patent Publication No. 2020-191420). In Japanese Laid-Open Patent Publication No. 2020-191420, during turn-off of a parasitic diode of the MOSFET, the flow of a displacement current from the main non-operating region to the sensing enabled region is suppressed by the low lifetime region and p-type base regions of the main MOSFET are disposed in an entire region of the main non-operating region excluding the sensing enabled region, whereby electric field at the front surface of the semiconductor substrate is uniform and local concentration of electric field at the field oxide film is suppressed.

SUMMARY OF THE INVENTION

According to an embodiment of the present invention, a semiconductor device having, on a semiconductor substrate containing silicon carbide and having a first main surface and a second main surface opposite to each other, an active region through which a main current flows, a termination region surrounding a periphery of the active region in a top view of the semiconductor device, and an intermediate region provided between the active region and the termination region in the top view of the semiconductor device, the semiconductor device comprising: a first semiconductor region of a first conductivity type, provided in the semiconductor substrate; a second semiconductor region of a second conductivity type, provided between the first main surface of the semiconductor substrate and the first semiconductor region, in the active region and the intermediate region; a third semiconductor region of the first conductivity type, selectively provided in the active region, between the first main surface of the semiconductor substrate and the second semiconductor region; a gate insulating film covering the first main surface of the semiconductor substrate and provided in contact with a region of the second semiconductor region, the region being between the first semiconductor region and the third semiconductor region; a gate electrode provided, via the gate insulating film, on the region of the second semiconductor region between the first semiconductor region and the third semiconductor region; a fourth semiconductor region of the second conductivity type, provided in the intermediate region, between the first main surface of the semiconductor substrate and the second semiconductor region, the fourth semiconductor region having an impurity concentration that is higher than an impurity concentration of the second semiconductor region; a field oxide film provided in the intermediate region, on the gate insulating film on the first main surface of the semiconductor substrate; a gate polysilicon wiring layer provided on the field oxide film and surrounding a periphery of the active region in the top view of the semiconductor device, an inner peripheral end of the gate polysilicon wiring layer being connected to the gate electrode, the gate polysilicon wiring layer facing the fourth semiconductor region in a depth direction with the field oxide film and the gate insulating film intervening therebetween; an interlayer insulating film covering the gate electrode and the gate polysilicon wiring layer; a first contact hole penetrating through the interlayer insulating film in the depth direction and exposing the first main surface of the semiconductor substrate; a first electrode electrically connected to the second semiconductor region, the third semiconductor region, and the fourth semiconductor region via the first contact hole; and a second electrode provided at the second main surface of the semiconductor substrate. The gate polysilicon wiring layer extends farther to the active region than is the inner peripheral end of the field oxide film, and, at an inner portion of the gate polysilicon wiring layer, faces the fourth semiconductor region in the depth direction via the gate insulating film only. The field oxide film has an inner peripheral end that is closer to the termination region than is the first contact hole, and positioned with a distance in a range of not more than 21 µm apart from the first contact hole.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a cross-sectional view depicting the structure along cutting line A-A' in FIG. 2A.

FIG. 4 is a cross-sectional view depicting the structure along cutting line B-B' in FIG. 2A.

FIG. 15 is cross-sectional view depicting the structure along cutting line BB-BB' in FIG. 13.

DETAILED DESCRIPTION OF THE INVENTION

Figure 13:
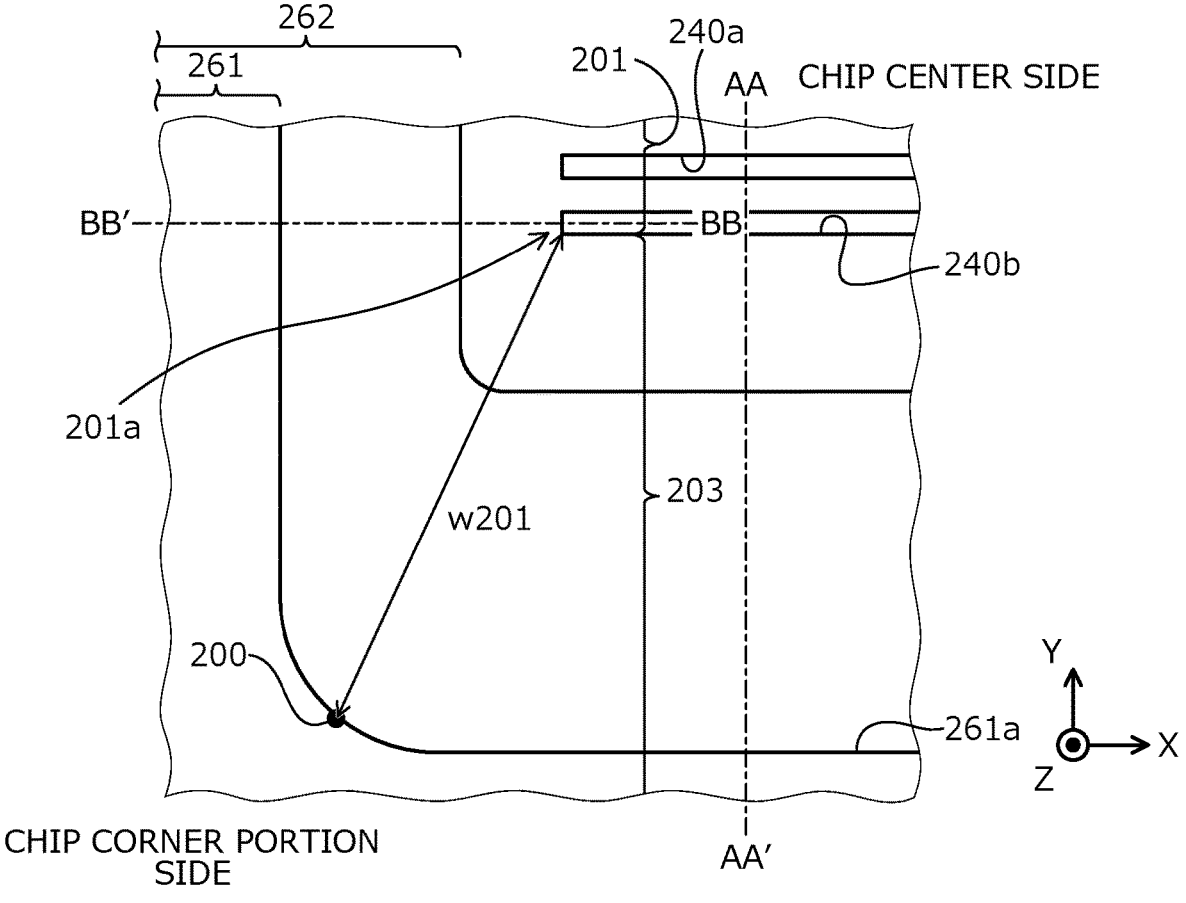
FIG. 13 is a plan view depicting a portion of a layout when a conventional silicon carbide semiconductor device is viewed from a front side of a semiconductor substrate thereof.
Figure 14:
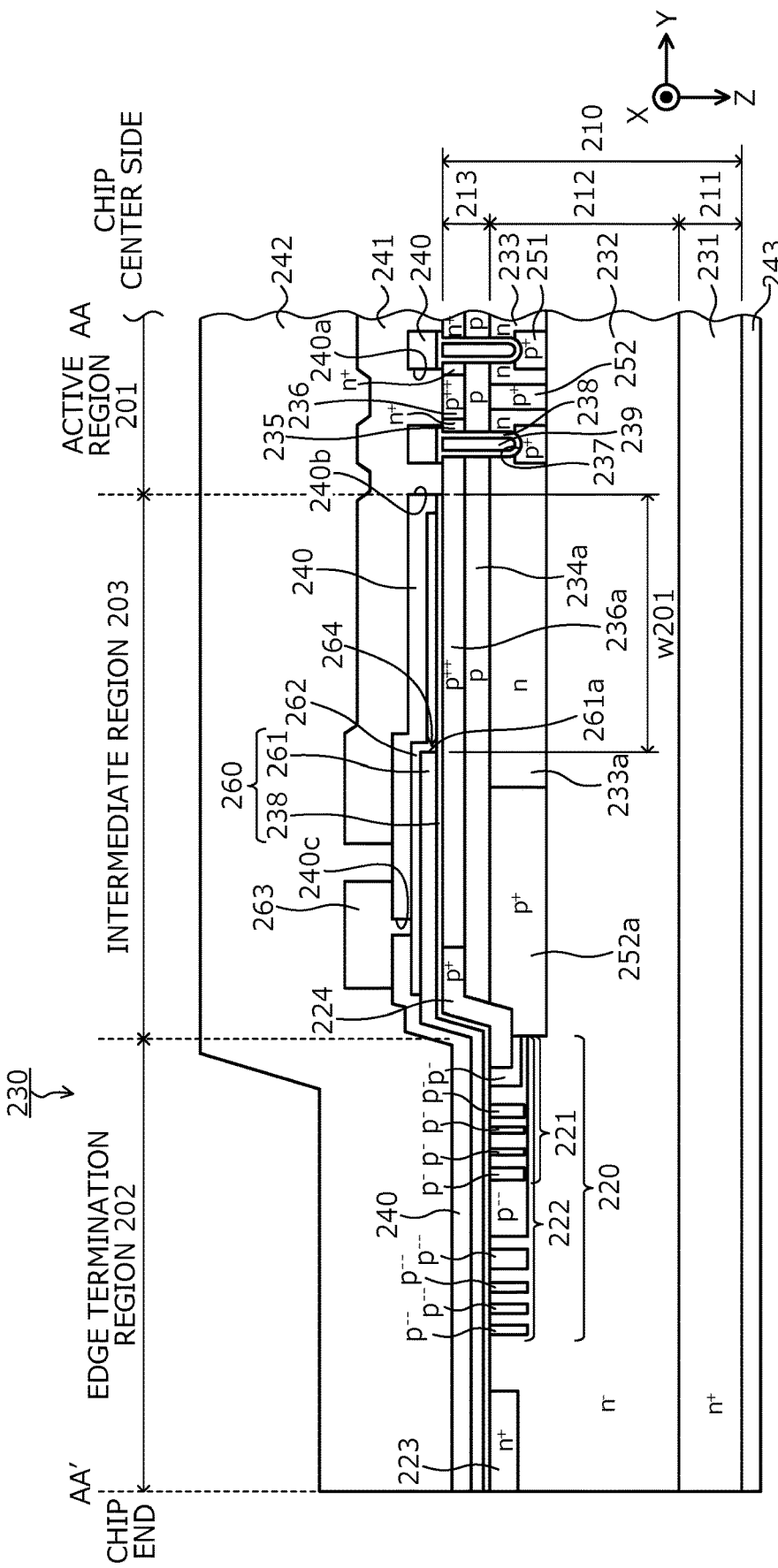
FIG. 14 is cross-sectional view depicting a structure along cutting line AA-AA' in FIG. 13.
Figure 15:
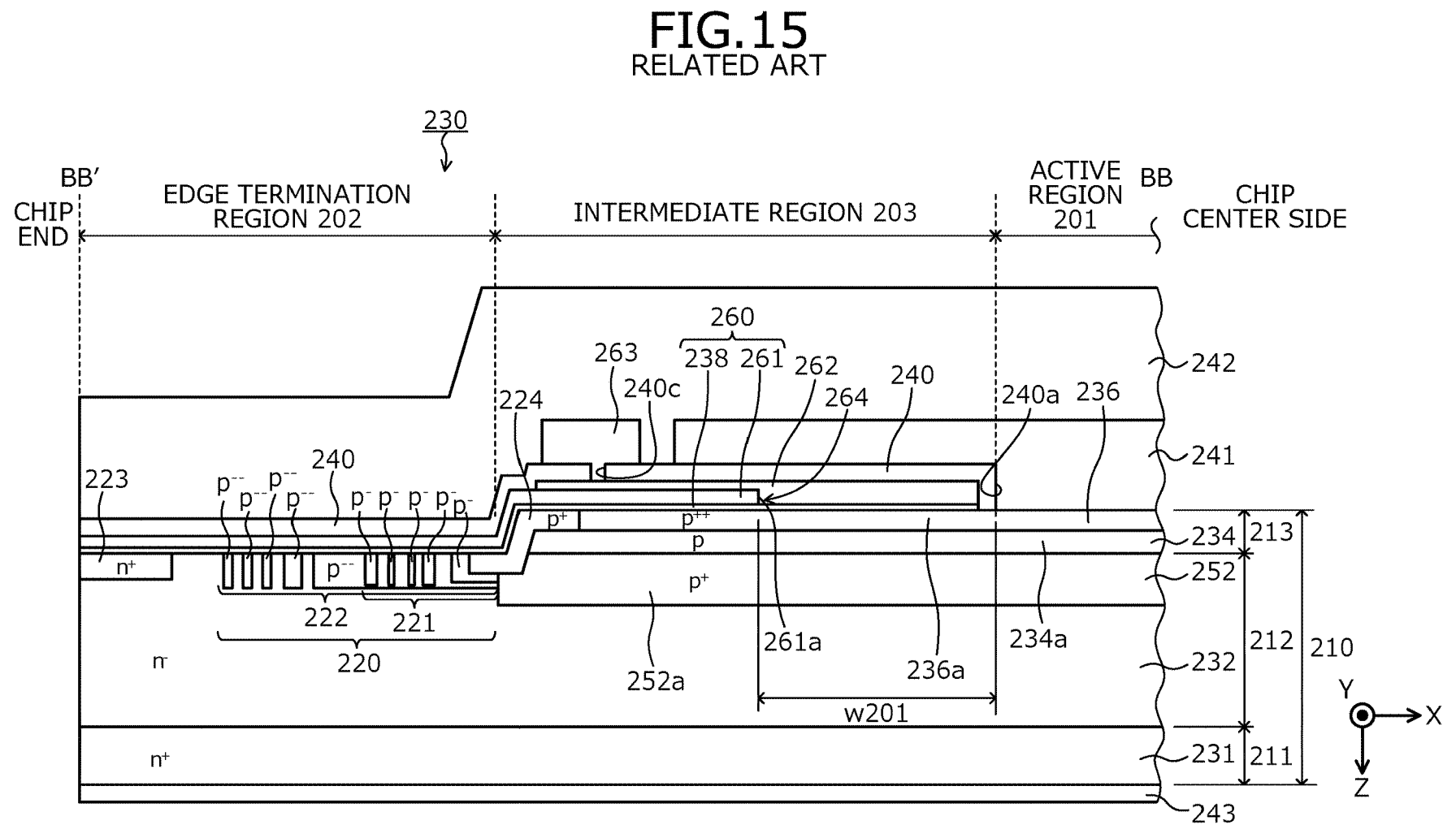

First problems associated with the conventional techniques are discussed. In the conventional silicon carbide semiconductor device 230 described above (SiC-MOSFET, refer to FIGS. 13 to 15), the following problems arise. A steep dV/dt (voltage change between a drain and source per unit time) occurs during the switching transition period when the MOSFET switches from on to off, whereby displacement current (hole current) occurs at the $n^-$-type drift region 232 of the edge termination region 202 and flows to the active region 201. The displacement current flows from the $n^-$-type drift region 232 of the edge termination region 202, through the $p^+$-type extension portion 252a and the p-type base extension portion 234a of the intermediate region 203 and into the $p^{++}$-type contact extension portion 236a, and is pulled out to a source electrode 241, from longitudinal ends of the contact holes 240a of the active region 201 and all regions of the outermost contact hole 240b of the active region 201.

At this time, carriers in the semiconductor substrate 210 decrease the lower is the temperature of the semiconductor substrate 210, and resistance of the $p^{++}$-type contact extension portion 236a increases by the amount of carrier decrease (refer to FIG. 12), the period of time that the displacement current is pulled out to the source electrode 241 increases, and potential of the semiconductor substrate 210, at the front surface thereof in the intermediate region 203 increases. Further, as dV/dt increases, the displacement current increases and the potential of the $p^{++}$-type contact extension portion 236a, which occupies a large proportion of a path of the displacement current, increases. Due to the rise of these potentials, high electric field is applied to the insulating layer 260 on the $p^{++}$-type contact extension portion 236a and in a thin portion (portion formed by only the gate insulating film 238) of the insulating layer 260, gate leakage current that passes through the gate insulating film 238, from the semiconductor substrate 210 to the gate polysilicon wiring layer 262 occurs at a location of the drop 264 that is a starting point of the displacement current, and the gate insulating film 238 breaks down dielectrically.

When silicon carbide is used as a semiconductor material, as compared to an instance in which silicon (Si) is used as a semiconductor material, the resistance of p-type regions is high and voltage drops increase at p-type regions (the $p^+$-type extension portion 252a, the p-type base extension portion 234a, and the $p^{++}$-type contact extension portion 236a) of the intermediate region 203. Thus, the electric field applied to the insulating layer 260 on the p-type regions of the intermediate region 203 increases and during the switching transition period, the thin portion of the insulating layer 260 configured by only the gate insulating film 238 tends to breakdown dielectrically. Further, the MOSFET is a unipolar device and thus, as compared to an insulated gate bipolar transistor (IGBT), cut-off speed (switching speed) is a faster and the dV/dt occurring during the switching transition period tends to be steep and in the insulating layer 260, the thin portion thereof configured only by the gate insulating film 238 easily degrades.

From a luminescence image by an emission microscope (EMS), the inventor confirmed that a location where the drop 264 of the surface of the insulating layer 260 in the corner portion 201a of the active region 201 and the gate polysilicon wiring layer 262 configuring the gate runner are curved inwardly in substantially a right angle along a gate pad (not depicted) and a gate resistance measuring electrode pad (not depicted) is a location (luminous location) where the displacement current concentrates. Further, it was confirmed that at a location where the displacement current concentrates degradation of the gate insulating film 238 occurs (in FIG. 13, a location 200 where displacement current concentrates at the drop 264 at the surface of the insulating layer 260 in the corner portion 201a of the active region 201 is indicated by a black dot). Further, in a product equipped with the conventional silicon carbide semiconductor device 230, under a low temperature of about −55 degrees C., dielectric breakdown of the gate insulating film 238 by the displacement current was confirmed by the inventor (refer to FIG. 11).

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and are not repeatedly described.

Figure 1:
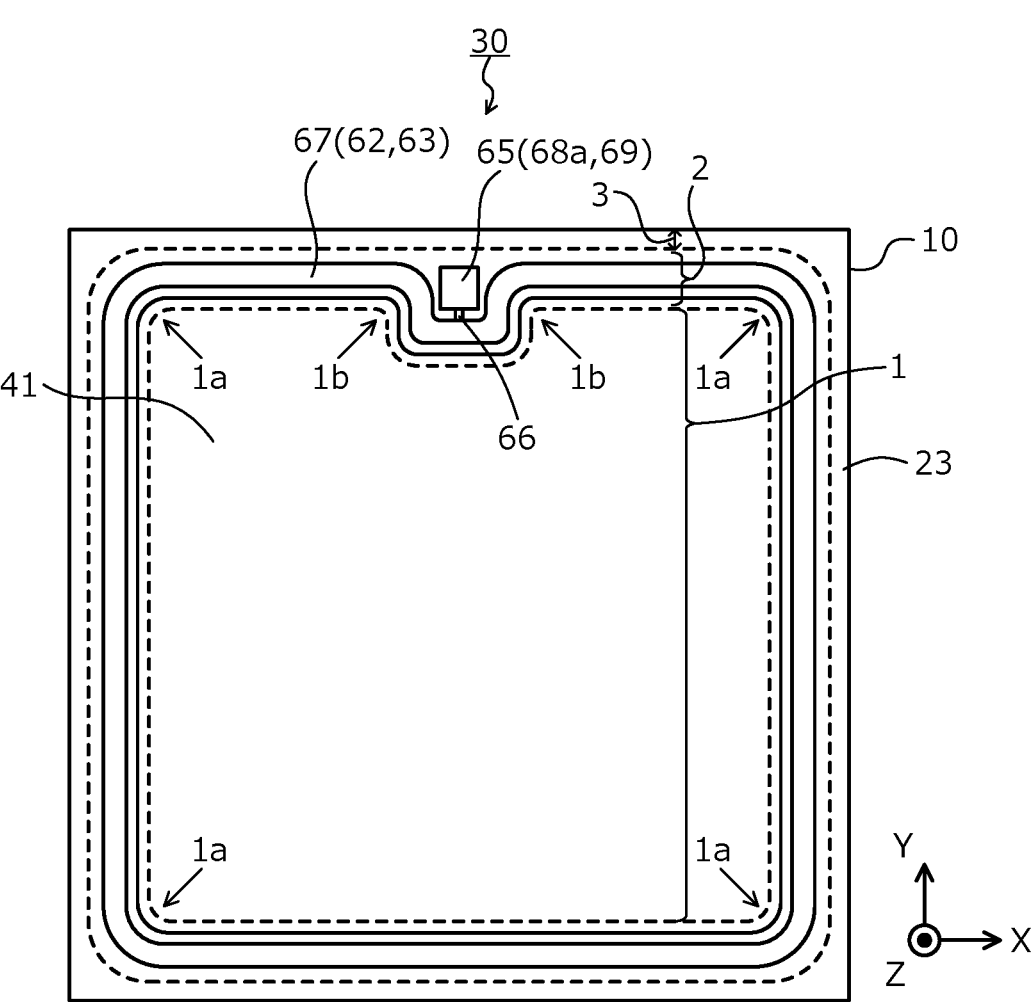
FIG. 1 is a plan view depicting a layout when a silicon carbide semiconductor device according to an embodiment is viewed from a front side of a semiconductor substrate thereof.
Figure 2A:
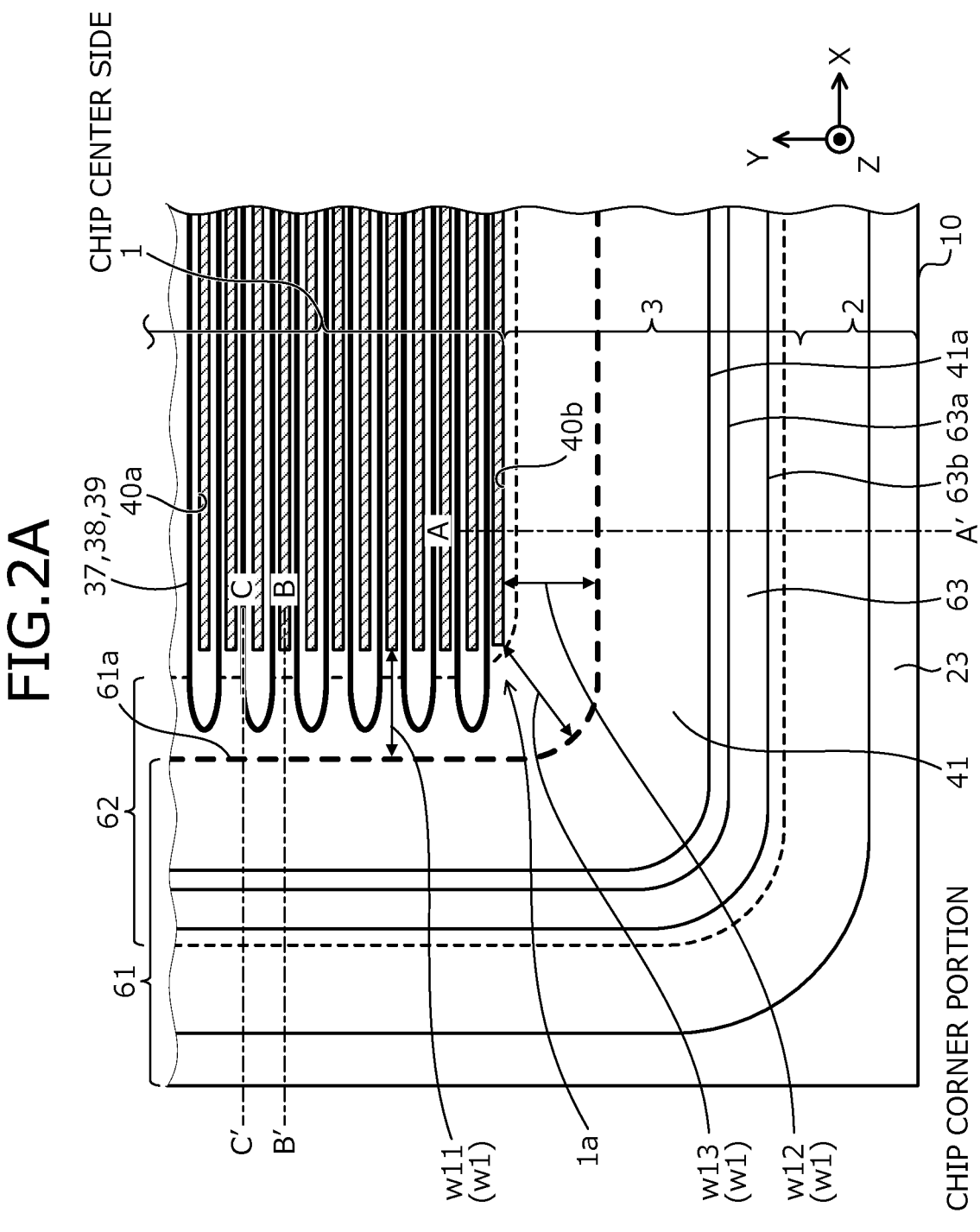
FIG. 2A is a plan view depicting an enlarged view of a vicinity of a corner portion (vertex) 1a of an active region 1 depicted in FIG. 1.
Figure 2B:
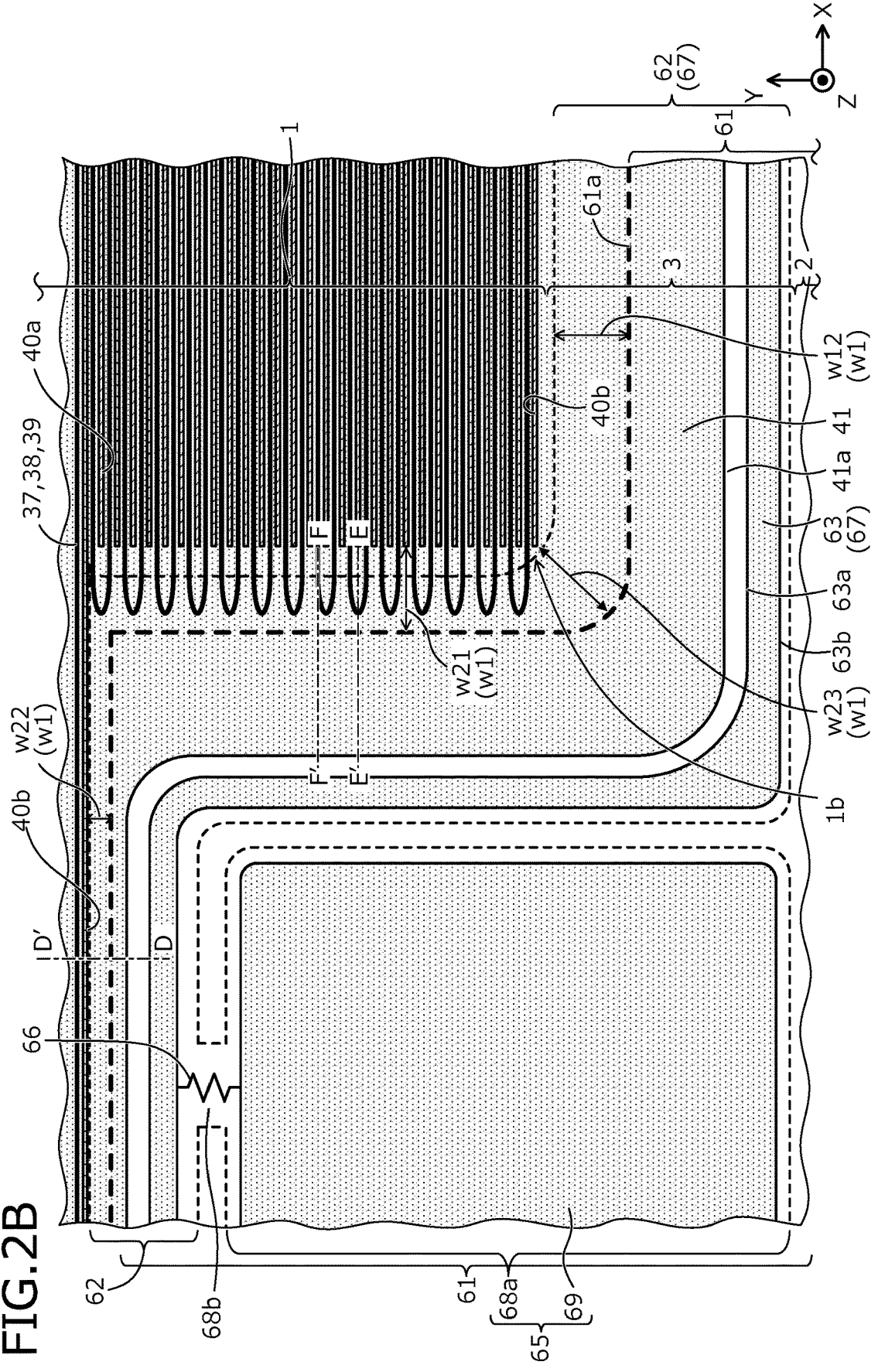
FIG. 2B is a plan view depicting an enlarged view of a vicinity of a gate pad of the active region depicted in FIG. 1.

A structure of a silicon carbide semiconductor device according to an embodiment is described. FIG. 1 is a plan view depicting a layout when the silicon carbide semiconductor device according to the embodiment is viewed from a front side of a semiconductor substrate thereof. In FIG. 1, coarse dashed lines are a border between an active region 1 and an intermediate region 3, and a border between the intermediate region 3 and an edge termination region 2 while a fine dashed line is an inner periphery of an $n^+$-type channel stopper region 23. In FIG. 1, to clearly depict arrangement of a gate runner 67, the gate runner 67 and a gate pad 65 are depicted in dimensions different from that in FIG. 2B, nonetheless, the dimensions, planar shapes, etc. are suitably set. An outer periphery of the $n^+$-type channel stopper region 23 is an outer periphery of a semiconductor substrate 10 that has a substantially rectangular shape in a plan view. FIG. 2A is a plan view depicting an enlarged view of a vicinity of a corner portion (vertex) 1a of the active region 1 depicted in FIG. 1. FIG. 2B is a plan view depicting an enlarged view of a vicinity of a gate pad of the active region depicted in FIG. 1.

Figure 3:
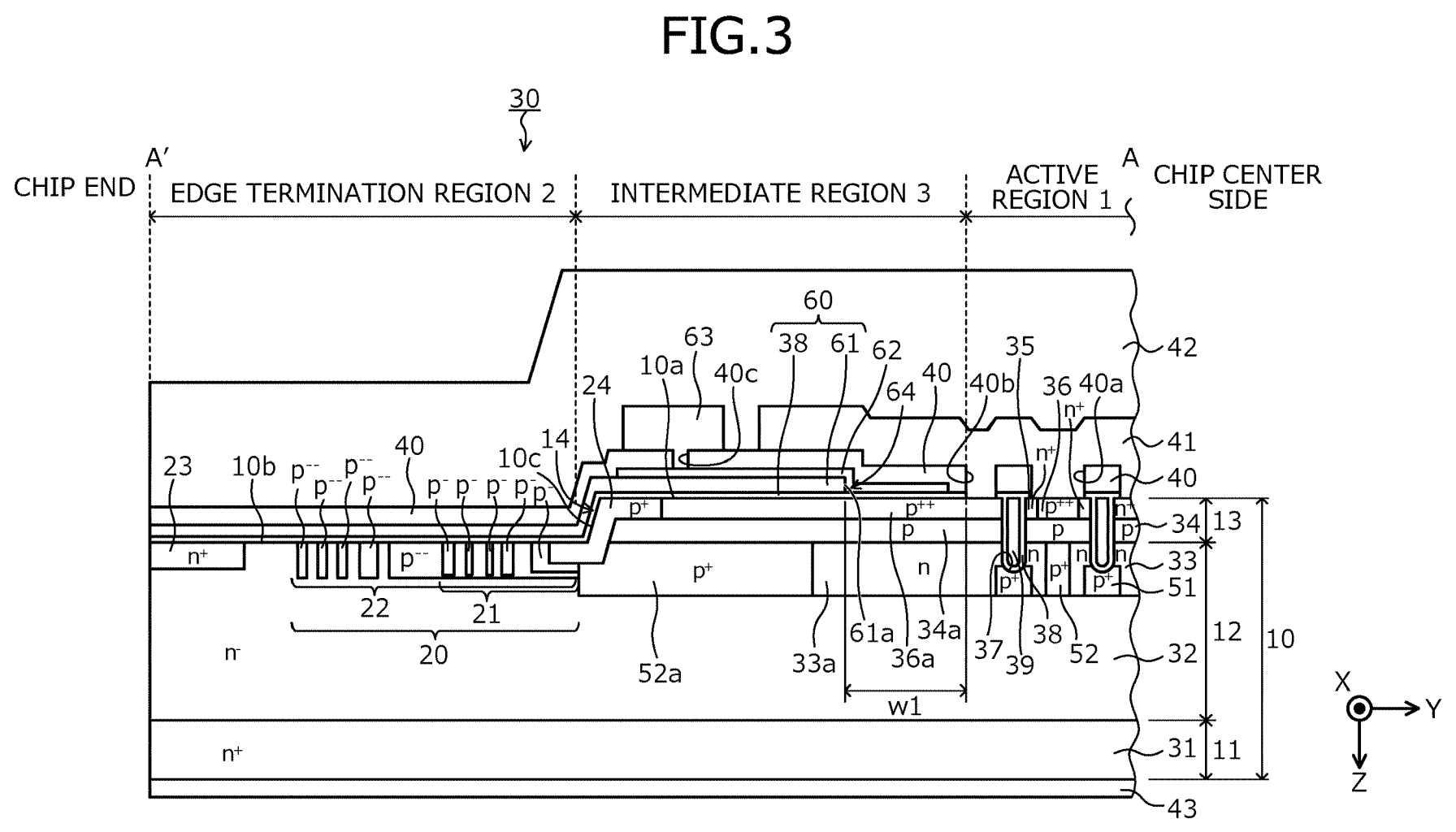
Figure 4:
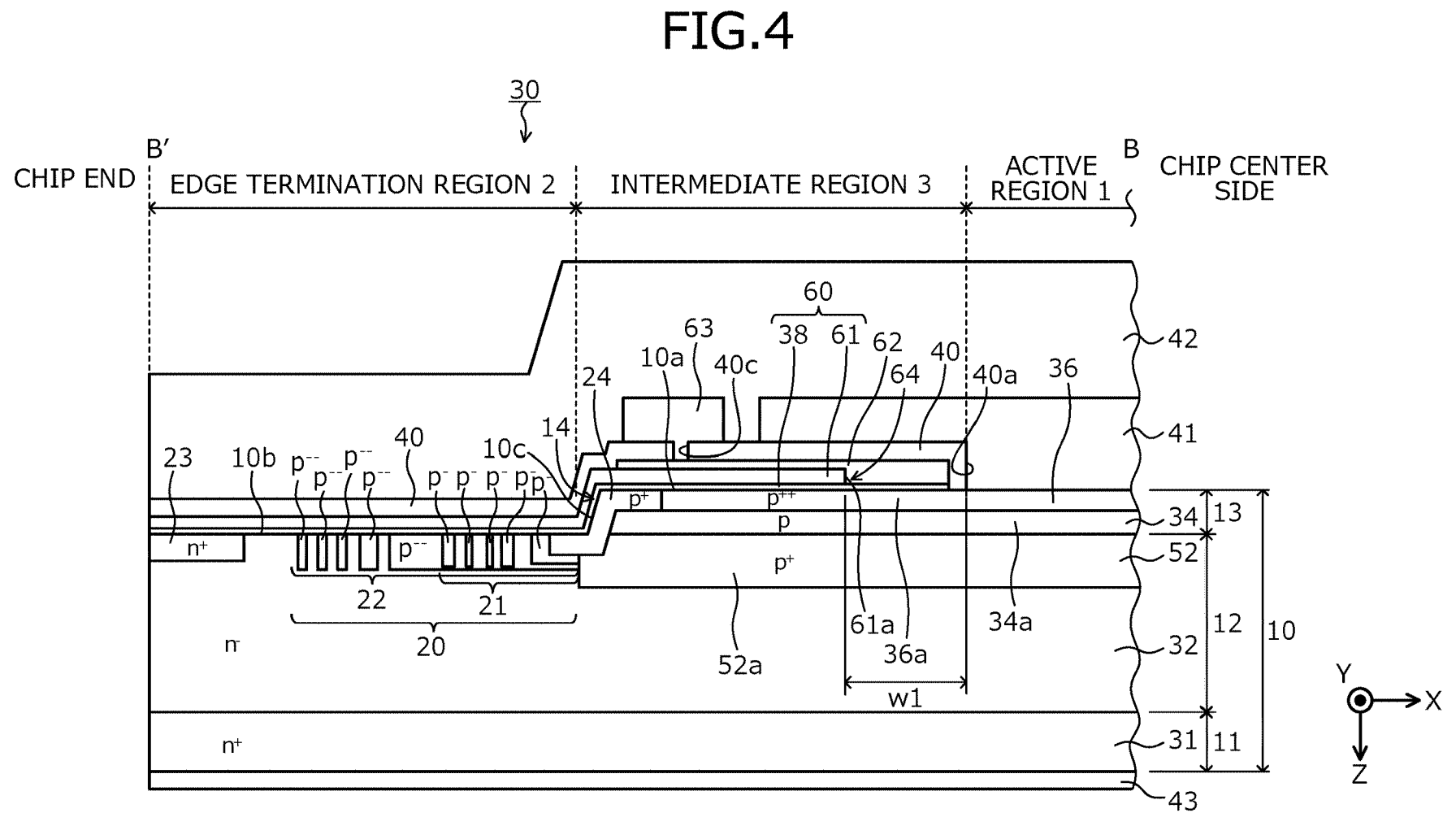
Figure 5:
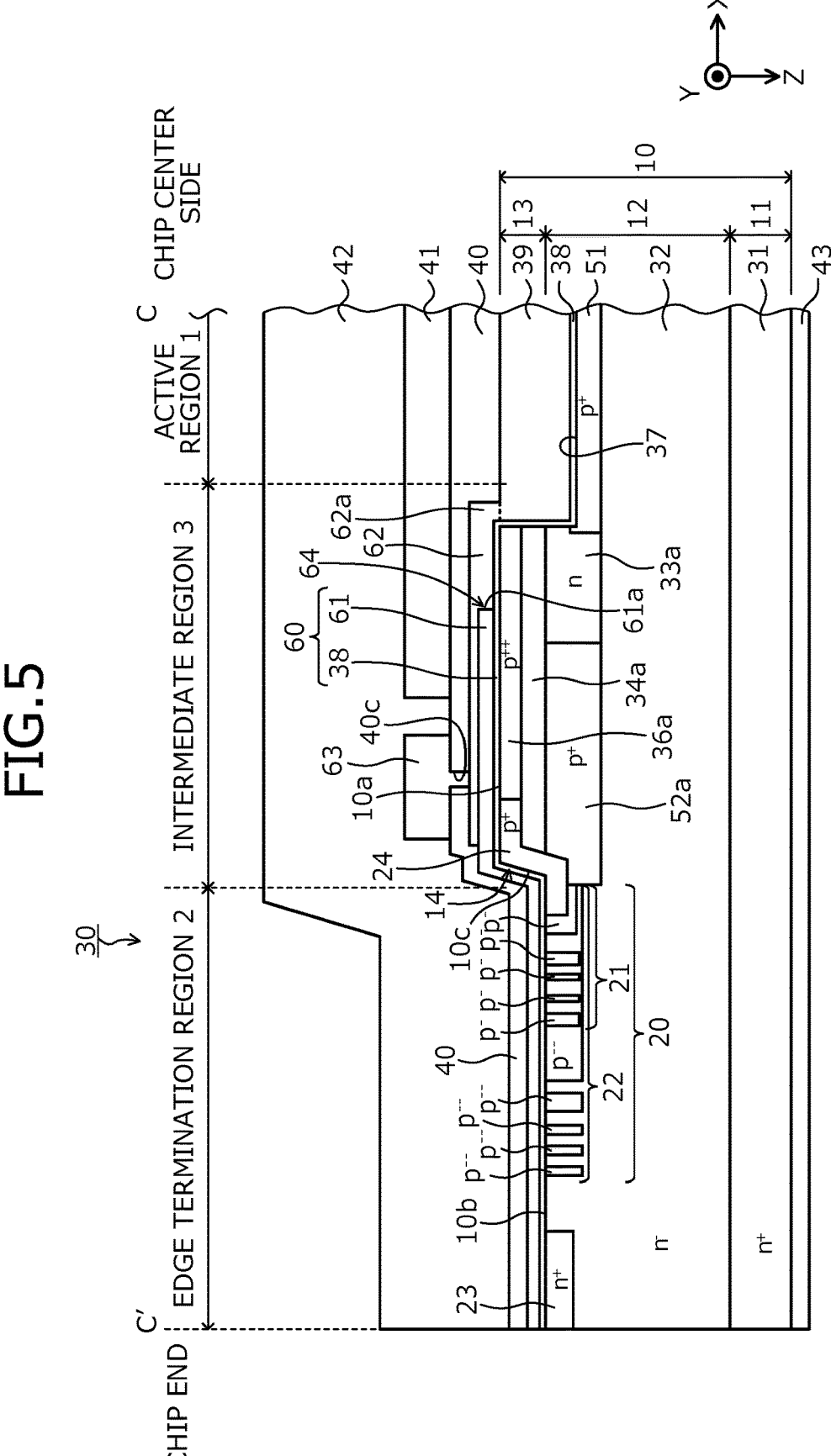
FIG. 5 is a cross-sectional view depicting the structure along cutting line C-C' in FIG. 2A.

In FIGS. 2A and 2B, gate trenches 37, a gate insulating film 38, and gate electrodes 39 are depicted collectively by a single bold line while contact holes (first contact holes) 40a, 40b, 40c of the active region 1 are indicated by hatching. An inner periphery (inner peripheral end 61a) of a field oxide film 61 is indicated by a coarse dashed line while an inner periphery and an outer periphery of a gate polysilicon wiring layer 62 are indicated by a fine dashed line. An outer periphery of the field oxide film 61 is an outer periphery of the semiconductor substrate 10. Reference character 41a is an outer periphery of a source electrode 41 and reference characters 63a and 63b are an inner periphery and an outer periphery of a gate metal wiring layer 63, respectively. FIGS. 3, 4, and 5 are cross-sectional views depicting, respectively, the structure along cutting line A-A', cutting line B-B', and cutting line C-C' in FIG. 2A.

A silicon carbide semiconductor device 30 according to the embodiment depicted in FIGS. 1, 2A, 2B, 3 to 5 is a vertical SiC-MOSFET with a trench gate structure having the active region 1 and the edge termination region 2 on the semiconductor substrate (semiconductor chip) 10, which contains silicon carbide (SiC). The active region 1 is a region through which a main current (drift current) flows when the MOSFET is on and in which multiple unit cells (constituent units of a device) each having the same MOSFET structure are disposed adjacent to one another. The active region 1 has a substantially rectangular shape in a plan view and is disposed in substantially a center (chip center) of the semiconductor substrate 10. In the corner portions (vertices) 1a of the active region 1, the later-described source electrode 41, the gate polysilicon wiring layer 62, and the gate metal wiring layer 63 may be chamfered and roughly arc-shaped.

The active region 1, in the later-described first direction X (longitudinal direction of the later-described gate trenches 37), is a region further inward (relatively closer to a chip center) than are longitudinal ends of the later-described contact holes 40a, 40b. The active region 1, in the later-described second direction Y (lateral direction of the gate trenches 37), is a region further inward than is an outer (relatively closer to an end (chip end) of the semiconductor substrate 1) sidewall of an outermost contact hole 40b. The longitudinal ends of the contact holes 40a, 40b of the active region 1 are side surfaces of an insulating layer (an interlayer insulating film 40 and the gate insulating film 38) forming the sidewalls of the contact holes 40a, 40b.

In the active region 1, the source electrode (first electrode) 41 is provided on the front surface of the semiconductor substrate 10. The source electrode 41 covers substantially an entire area of the active region 1. The source electrode 41 may extend into the later-described intermediate region 3 and face the later-described gate polysilicon wiring layer 62 in the depth direction Z with the interlayer insulating film 40 intervening therebetween. A portion of the source electrode 41 in an opening of a later-described passivation film 42 (refer to FIGS. 3 to 5) functions as a source pad (electrode pad). In FIG. 1, while the active region 1, the source electrode 41, and the source pad are depicted having, in a plan view, a substantially rectangular shape with a recessed portion that surrounds three sides of the later-described gate pad 65 that has a substantially rectangular shape in a plan view, the planar shapes of these parts is suitably set.

The intermediate region 3 between the active region 1 and the edge termination region 2 is adjacent to the active region 1 and surrounds the periphery of the active region 1. The border between the intermediate region 3 and the edge termination region 2 is an inner peripheral end of a voltage withstanding structure (in FIGS. 3 to 5, an inner peripheral end of an innermost one of p⁻-type regions 21 configuring a later-described FLR structure 20). In the intermediate region 3, the gate pad (electrode pad) 65, a gate resistor 66, and the gate runner 67 are disposed. The gate pad 65 is configured by a gate polysilicon wiring layer 68a and a gate metal wiring layer 69. The gate pad 65 may have, for example, in a plan view, a substantially rectangular shape with rounded corner portions.

The gate pad 65 is disposed apart from the gate runner 67 and is closer to the chip end than is the gate runner 67. The gate resistor 66, for example, is configured by a gate polysilicon wiring layer 68b. The gate resistor 66 is disposed between the gate pad 65 and the gate runner 67 and electrically connects the gate pad 65 and the gate runner 67. In particular, the gate polysilicon wiring layer 68b that configures the gate resistor 66 connects the gate polysilicon wiring layer 68a that configures the gate pad 65 and the later-described gate polysilicon wiring layer 62 that configures the gate runner 67.

The gate runner 67 is configured by the gate polysilicon wiring layer 62 and the gate metal wiring layer 63. The gate polysilicon wiring layer 62 is disposed apart from the contact holes 40a, 40b of the active region 1 and surrounds the periphery of the active region 1. The gate metal wiring layer 63 is disposed apart from the source electrode 41 and surrounds a periphery of the source electrode 41. The gate runner 67, between the active region 1 and the gate pad 65, curves inwardly along the gate pad 65 at substantially a right angle and extends so as to surround three sides of the gate pad 65. In other words, the gate runner 67 has, in a plan view, a substantially rectangular shape that is recessed inwardly at a portion facing the gate pad 65.

In the intermediate region 3, a gate resistance measuring electrode pad (electrode pad, not depicted) may be disposed. The gate resistance measuring electrode pad, similar to the gate pad 65, is disposed closer to the chip end than is the gate runner 67 and is electrically connected to the gate runner 67 via a gate resistor (not depicted). Thus, even between the active region 1 and the gate resistance measuring electrode pad, similar to the portion between the active region 1 and the gate pad 65, the gate runner 67 curves inwardly along the gate resistance measuring electrode pad in substantially a right angle and extends in a planar shape that is recessed inwardly so as to surround three sides of the gate resistance measuring electrode pad, in a plan view.

As described, even in a vicinity of the gate pad 65 and a vicinity of the gate resistance measuring electrode pad, similar to the corner portions 1a of the active region 1, an inner corner portion of the gate polysilicon wiring layer 62 has a part 1b that forms substantially a right angle. The edge termination region 2 is a region between the active region 1 and the chip ends, surrounds the periphery of the active region 1 with the intermediate region 3 intervening therebetween, and sustains a breakdown voltage by mitigating electric field of the front side of the semiconductor substrate 10. The breakdown voltage is a voltage limit at which even when avalanche breakdown occurs at a pn junction and current between a source and drain increases, the current between the source and drain does not increase beyond this.

In the edge termination region 2, a voltage withstanding structure such as a junction termination extension (JTE) structure, a field limiting ring (FLR) structure, etc. is provided. By the voltage withstanding structure, electric field of the edge termination region 2 is mitigated or distributed. In the edge termination region 2, a field plate (FP), which is a floating potential metal electrode is disposed, and may be a structure that causes a later-described insulating layer 60 and the interlayer insulating film 40 to release charge accumulated over time.

The semiconductor substrate 10 is an epitaxial substrate formed by sequentially growing, on a front surface of an n⁺-type starting substrate 11 containing silicon carbide, epitaxial layers 12, 13 constituting, respectively, an n⁻-type drift region (first semiconductor region) 32 and p-type base regions (second semiconductor regions) 34. The semiconductor substrate 10 has, as the front surface (first main surface), a main surface having the p-type epitaxial layer 13 and has, as a back surface (second main surface), a main surface having the n⁺-type starting substrate 11. The n⁺-type starting substrate 11 is an n⁺-type drain region 31. A portion of the p-type epitaxial layer 13 in the edge termination region 2 is removed, thereby forming a drop 14 at the front surface of the semiconductor substrate 10.

The front surface of the semiconductor substrate 10, with the drop 14 as a border, is recessed more in a direction to the n⁺-type drain region 31 at a portion (hereinafter, second portion) 10b of the edge termination region 2 than at a portion (hereinafter, first portion) 10a of the active region 1 and the intermediate region 3. The second portion 10b of the front surface of the semiconductor substrate 10 is an exposed surface of the n⁻-type epitaxial layer 12, exposed by removal of the p-type epitaxial layer 13. In a portion (third portion: mesa edge of the drop 14) 10c connecting the first portion 10a and the second portion 10b of the front surface of the semiconductor substrate 10 is a side surface of the p-type epitaxial layer 13 exposed by the removal of the p-type epitaxial layer 13.

In the active region 1, in the semiconductor substrate 10, at the first portion 10a of the front surface thereof, a trench gate structure including the p-type base regions 34, n⁺-type source regions (third semiconductor regions) 35, p⁺⁺-type contact regions 36, the gate trenches 37, the gate insulating film 38, and the gate electrodes 39 is provided. The gate trenches 37 extend linearly to the intermediate region 3, in the first direction X (longitudinal direction), which is parallel to the front surface of the semiconductor substrate 10. The gate trenches 37 are disposed adjacent to one another in a striped pattern in the second direction Y (lateral direction), which is parallel to the front surface of the semiconductor substrate 10 and orthogonal to the first direction X.

The gate trenches 37 are disposed adjacently in the second direction Y, whereby multiple unit cells each having the same structure are disposed adjacently in the second direction Y. Ends of any adjacent two of the gate trenches 37, for example, are connected to each other in an arc shape in a plan view, and the gate trenches 37 may be disposed so as to form, in a plan view, a ring shape surrounding a portion between the any adjacent two of the gate trenches 37 (refer to FIGS. 2A and 2B). The gate trenches 37 penetrate through the p-type epitaxial layer 13 from the first portion 10a of the front surface of the semiconductor substrate 10 and reach the n⁻-type epitaxial layer 12. The gate insulating film 38 is provided along inner walls of the gate trenches 37.

Further, the gate insulating film 38 extends onto the front surface of the semiconductor substrate 10 from the inner walls of the gate trenches 37 and on the front surface of the semiconductor substrate 10 and reaches the chip end from the active region 1. The gate electrodes 39 are provided on the gate insulating film 38 so as to be embedded in the gate trenches 37. The gate electrodes 39, at the longitudinal ends of the gate trenches 37, are connected to the later-described gate polysilicon wiring layer 62. The p-type base regions 34, the n⁺-type source regions 35, and the p⁺⁺-type contact regions 36 are each selectively provided between all adjacent two of the gate trenches 37.

The p-type base regions 34 are portions of the p-type epitaxial layer 13, excluding the n⁺-type source regions 35, the p⁺⁺-type contact regions 36, and a later-described p⁺⁺-type contact extension part 36a, and are in contact with the gate insulating film 38 at the sidewalls of the gate trenches 37. The p-type base regions 34 extend outward (toward the chip end) from the active region 1 and reach the third portion 10c of the front surface of the semiconductor substrate 10. The p-type base regions 34 are provided in an entire area of the active region 1 and the intermediate region 3. A portion (hereinafter, p-type base extension portion (second semiconductor region) 34a of the p-type base regions 34 extending into the intermediate region 3 surrounds the periphery of the active region 1 in substantially a rectangular shape.

The n⁺-type source regions 35 and the p⁺⁺-type contact regions 36 are each selectively provided in contact with the p-type base regions 34, between the first portion 10a of the front surface of the semiconductor substrate 10 and the p-type base regions 34, and are exposed at the first portion 10a of the front surface of the semiconductor substrate 10. Being exposed at the first portion 10a of the front surface of the semiconductor substrate 10 means being in contact with the source electrode 41 at the first portion 10a of the front surface of the semiconductor substrate 10. The n⁺-type source regions 35 are in contact with the gate insulating film 38 at the sidewalls of the gate trenches 37. The p⁺⁺-type contact regions 36 are disposed farther from the gate trenches 37 than are the n⁺-type source regions 35.

The n⁺-type source regions 35 (not depicted in FIG. 4) and the p⁺⁺-type contact regions 36 extend linearly in the first direction X and have substantially a same length as the length of the later-described contact holes 40a in the longitudinal direction. Substantially the same length means the same length within a range that includes allowable error due to process variation. The p⁺⁺-type contact regions 36 are connected at ends thereof in the longitudinal direction (the first direction X), to the p⁺⁺-type contact extension portion (fourth semiconductor region) 36a. An impurity concentration of the p⁺⁺-type contact regions 36, for example, is in a range of about $1 \times 10^{19}/cm^3$ to $1 \times 10^{21}/cm^3$ and in particular, may be about $1 \times 10^{20}/cm^3$.

The p⁺⁺-type contact regions 36 may be omitted. In this case, instead of the p⁺⁺-type contact regions 36, the p-type base regions 34 reach and are exposed at the first portion 10a of the front surface of the semiconductor substrate 10. A pattern of the n⁺-type source regions 35 and the p⁺⁺-type contact regions 36 is not limited hereto and may be variously changed. For example, the n⁺-type source regions 35 may be disposed in a lattice-like pattern, surrounding peripheries of the p⁺⁺-type contact regions 36 that are scattered in the longitudinal direction of the trenches, or the n⁺-type source regions 35 and the p⁺⁺-type contact regions 36 may be disposed in a striped pattern extending in the lateral direction orthogonal to the longitudinal direction of the trenches.

The n⁻-type drift region 32 is disposed between the p-type base regions 34 and the n⁺-type drain region 31 and is in contact with the n⁺-type drain region 3. The n⁻-type drift region 32 extends from the active region 1 to the chip end. Between the p-type base regions 34 and the n⁻-type drift region 32, n-type current spreading regions 33 and first and second p⁺-type regions 51, 52 may be selectively provided at deep positions closer to the n⁺-type drain region 31 than are bottoms of the gate trenches 37. The n-type current spreading regions 33 and the first and second p⁺-type regions 51, 52 extend linearly in the first direction X and have a substantially same length as the length of the gate trenches 37 in the longitudinal direction.

The n-type current spreading regions 33 is a so-called current spreading layer (CSL) that reduces carrier spreading resistance. The n-type current spreading regions 33 are in contact with the first and second p⁺-type regions 51, 52 and the gate insulating film 38 in the second direction Y. The n-type current spreading regions 33, at upper surfaces thereof (ends facing the n⁺-type source regions 35), are in contact with the p-type base regions 34. The n-type current spreading regions 33 are connected to a later-described n-type current spreading extension portion 33a. In an instance in which the n-type current spreading regions 33 is omitted, the n⁻-type drift region 32 extends toward the front surface of the semiconductor substrate 10 and is in contact with the p-type base regions 34.

The first and second p⁺-type regions 51, 52 have a function of mitigating electric field applied to the gate insulating film 38 at the bottoms of the gate trenches 37. Depth positions of the first and second p⁺-type regions 51, 52 may be suitably set. For example, the first and second p⁺-type regions 51, 52 may terminate at shallow depth positions farther from the n⁺-type drain region 31 than are the n-type current spreading regions 33 and may be substantially entirely surrounded by the n-type current spreading regions 33. Alternatively, the first and second p⁺-type regions 51, 52 may reach substantially the same depth positions in the depth direction Z as that of the n-type current spreading regions 33 or may reach deep positions closer to the n⁺-type drain region 31 than are the n-type current spreading regions 33 and be in contact with the n⁻-type drift region 32.

The first and second p⁺-type regions 51, 52, at ends thereof in the longitudinal direction (the first direction X) are connected to a later-described p⁺-type extension portion 52a (not depicted). The first p⁺-type regions 51 are provided apart from the p-type base regions 34 and face the bottoms of the gate trenches 37 in the depth direction Z. The first p⁺-type regions 51 may reach the bottoms of the gate trenches 37. Other p⁺-type regions (not depicted) may be disposed at predetermined locations between the first and second p⁺-type regions 51, 52 or a portion of the first p⁺-type regions 51 may extend toward the second p⁺-type regions 52 whereby, the first $p^+$-type regions 51 may be electrically connect to the second $p^+$-type regions 52 at predetermined locations.

The second $p^+$-type regions 52 each are provided between any adjacent two of the gate trenches 37 and are apart from the first $p^+$-type regions 51 and the gate trenches 37. Upper surfaces of the second $p^+$-type regions 52 are in contact with the p-type base regions 34. A portion of the $n^-$-type epitaxial layer 12 excluding the n-type current spreading regions 33, the first and second $p^+$-type regions 51, 52, the $p^+$-type extension portion 52a, the later-described $p^-$-type regions 21, later-described the $p^{--}$-type regions 22, and later-described the $n^+$-type channel stopper region 23 constitutes the $n^-$-type drift region 32. The $n^-$-type drift region 32 is disposed between and in contact with these regions and the $n^+$-type drain region 31.

The interlayer insulating film 40 is provided on the gate insulating film 38 of the front surface of the semiconductor substrate 10, in an entire area of the front surface of the semiconductor substrate 10 so as to cover the gate electrodes 39, the later-described field oxide film 61, and the later-described gate polysilicon (poly-Si) wiring layer 62. In the active region 1, the contact holes 40a, 40b that penetrate through the interlayer insulating film 40 and the gate insulating film 38 in the depth direction Z and reach the front surface of the semiconductor substrate 10 are provided. The contact holes 40a, 40b of the active region 1 extend linearly in a striped shape in the first direction X so that a distance w1 to a drop 64 of the surface of the later-described insulating layer 60 is within a later-described predetermined range.

The outermost contact holes 40b of the active region 1 are provided closer to the chip end in the second direction Y than are outermost ones of the gate trenches 37. In an entire area of the outermost contact holes 40b of the active region 1, the later-described $p^{++}$-type contact extension part 36a is exposed. The $n^+$-type source regions 35 are not provided closer to the chip end in the second direction Y than are the outermost ones of the gate trenches 37. The other contact holes 40a excluding the outermost contact holes 40b of the active region 1 are each provided between any adjacent two of the gate trenches 37, expose the $n^+$-type source regions 35 and the $p^{++}$-type contact regions 36, and at the ends thereof in the longitudinal direction (the first direction X), expose the $p^{++}$-type contact extension part 36a.

In the intermediate region 3, in the semiconductor substrate 10, at the first portion 10a of the front surface thereof, the $p^{++}$-type contact extension part 36a is provided at a position facing the later-described gate polysilicon wiring layer 62 in the depth direction Z. The $p^{++}$-type contact extension part 36a is a portion of the $p^{++}$-type contact regions 36 extending into the intermediate region 3. The $p^{++}$-type contact extension part 36a is provided in an entire area between the first portion 10a of the front surface of the semiconductor substrate 10 and the p-type base extension portion 34a and is exposed at the first and third portions 10a, 10c of the front surface of the semiconductor substrate 10, in the intermediate region 3. The p-type base extension portion 34a is exposed at the third portion 10c of the front surface of the semiconductor substrate 10.

Being exposed at the first to third portions 10a to 10c of the front surface of the semiconductor substrate 10, in the intermediate region 3 and the edge termination region 2 means being in contact with the gate insulating film 38 on the first to third portions 10a to 10c. The p-type base extension portion 34a and the $p^{++}$-type contact extension part 36a surround the periphery of the active region 1 and extend inward toward the chip center from the intermediate region 3 to the gate trenches 37. The p-type base extension portion 34a and the $p^{++}$-type contact extension part 36a may extend in the first direction X to the adjacent gate trenches 37. The $p^{++}$-type contact extension part 36a is exposed in an entire area of the outermost contact holes 40b of the active region 1.

The $p^{++}$-type contact extension part 36a may be exposed at the longitudinal ends of the contact holes 40a of the active region 1. The $p^{++}$-type contact extension part 36a has a function of pulling out displacement current (hole current) to the source electrode 41, via the outermost contact holes 40b of the active region 1, the displacement current occurring in the $n^-$-type drift region 32 of the edge termination region 2 during the switching transition period when the MOSFET switches from on to off. In an instance in which the $p^{++}$-type contact regions 36 are omitted, the $p^{++}$-type contact extension part 36a is in contact with the p-type base regions 34. An impurity concentration of the $p^{++}$-type contact extension part 36a is, for example, in a range of about $1\times10^{19}$/cm$^3$ to $1\times10^{21}$/cm$^3$ and in particular, is about $1\times10^{20}$/cm$^3$.

The $p^+$-type extension portion 52a and the n-type current spreading extension portion 33a may each be selectively provided between the p-type base extension portion 34a and the $n^-$-type drift region 32. The $p^+$-type extension portion 52a and the n-type current spreading extension portion 33a are, respectively, portions of the second $p^+$-type regions 52 and the n-type current spreading regions 33 extending into the intermediate region 3. The $p^+$-type extension portion 52a is disposed apart from the gate trenches 37 and surrounds the periphery of the active region 1. The $p^+$-type extension portion 52a extends outward from the drop 14 to a position exposed at the second portion 10b of the front surface of the semiconductor substrate 10. The $p^+$-type extension portion 52a may be exposed at the third portion 10c of the front surface of the semiconductor substrate 10.

The n-type current spreading extension portion 33a is provided between the $p^+$-type extension portion 52a and the gate trenches 37, surrounds the periphery of the active region 1, and extends inward from the intermediate region 3 to the gate trenches 37. The n-type current spreading extension portion 33a may extend between any adjacent two of the gate trenches 37 in the first direction X. Between the third portion 10c of the front surface of the semiconductor substrate 10 and, the $p^{++}$-type contact extension part 36a, the p-type base extension portion 34a and the $p^+$-type extension portion 52a, a $p^+$-type region 24 may be provided so as to connect these regions. The $p^+$-type region 24 may extend outward from the drop 14 to a position exposed at the second portion 10b of the front surface of the semiconductor substrate 10.

In the intermediate region 3 and the edge termination region 2, an entire area of the front surface of the semiconductor substrate 10 is covered by the insulating layer in which the gate insulating film 38, the field oxide film 61, and the interlayer insulating film 40 are sequentially stacked in the order stated. The entire area of the front surface of the semiconductor substrate 10 in the intermediate region 3 and the edge termination region 2 is in contact with the gate insulating film 38. In the intermediate region 3, the gate polysilicon wiring layer 62 and the gate metal wiring layer 63 constituting the gate runner 67 are sequentially stacked in the order stated on the gate insulating film 38 of the front surface of the semiconductor substrate 10, via the field oxide film 61. The gate polysilicon wiring layer 62 and the gate metal wiring layer 63 surround the periphery of the active region 1.

The field oxide film 61 and the gate polysilicon wiring layer 62 are provided between the gate insulating film 38 and the interlayer insulating film 40. The inner peripheral end 61*a* of the field oxide film 61 is positioned farther outward and apart from the sidewalls of the contact holes 40*a*, 40*b* of the active region 1 (in other words, the border between the active region 1 and the intermediate region 3). Further, the inner peripheral end 61*a* of the field oxide film 61 is positioned closer to the chip end than is a connecting part 62*a* of the gate polysilicon wiring layer 62 and the gate electrodes 39. At the longitudinal ends of the gate trenches 37, the gate polysilicon wiring layer 62 is disposed on the front surface of the semiconductor substrate 10, via only the gate insulating film 38.

In particular, the inner peripheral end 61*a* of the field oxide film 61, at all locations of an outer periphery of the active region 1, is positioned directly beneath the gate polysilicon wiring layer 62 and is apart from the sidewalls of the contact holes 40*a*, 40*b* of the active region 1 by about 21 μm or less toward the chip end and within the range of the distance w1. At the inner peripheral end 61*a* of the field oxide film 61, the distance w1 from the later-described drop 64 formed at the surface of the later-described insulating layer 60 to the contact holes 40*a*, 40*b* of the active region 1, even in the corner portions 1*a* of the active region 1 where the distance w1 is the greatest, is about 21 μm, which is about one half of the same maximum distance w201 (FIGS. 13 to 15) in the conventional structure.

The distance w1 from the drop 64 of the surface of the insulating layer 60 to the contact holes 40*a*, 40*b* of the active region 1 may be preferably shorter and, for example, may be about 5 μm, which is a process limit, to not more than about 10 μm. The shorter is the distance w1, the shorter the length of the relatively thin portion of the insulating layer 60 (in the insulating layer 60, the inner portion formed by only the gate insulating film 38) in the direction of the normal (direction from the chip center toward the chip end) may be, whereby the strength of the electric field applied to the insulating layer 60 due to the displacement current generated during the switching transition period from on to off of the MOS-FET may be reduced.

The distance w1 from the drop 64 of the surface of the insulating layer 60 to the contact holes 40*a*, 40*b* of the active region 1 is the shortest distance w11 from the inner peripheral end 61*a* of the field oxide film 61 to the longitudinal ends of the contact holes 40*a*, 40*b* of the active region 1 in the first direction X, the shortest distance w12 from the inner peripheral end 61*a* of the field oxide film 61 to an outer sidewall of the outermost contact holes 40*b* of the active region 1 in the second direction Y, and at the corner portions 1*a* of the active region 1, the shortest distance w13 from the inner peripheral end 61*a* of the field oxide film 61 to the longitudinal ends of the outermost contact holes 40*b* of the active region 1 in a direction oblique to the first and second directions X, Y.

The insulating layer 60 in which the gate insulating film 38 and the field oxide film 61 are sequentially stacked in the order stated is between the front surface of the semiconductor substrate 10 and the gate polysilicon wiring layer 62. The insulating layer 60 extends from the intermediate region 3 to the chip end. The insulating layer 60 has a relatively thick portion formed by the gate insulating film 38 and the field oxide film 61 that are sequentially stacked in the order stated and a relatively thin portion closer to the chip center and formed by only the gate insulating film 38. Due to the difference in thickness in the insulating layer 60, at the surface of the insulating layer 60, closer to the chip center than is the inner peripheral end 61*a* of the field oxide film 61, the drop 64 recessed toward a drain electrode 43 is formed. The drop 64 is formed in an entire periphery of the intermediate region 3 and surrounds the periphery of the active region 1.

The gate polysilicon wiring layer 62 is provided on the field oxide film 61, extends inward from on the field oxide film 61 and passes through the drop 64 of the inner peripheral end 61*a* of the field oxide film 61 and terminates on the gate insulating film 38 of the front surface of the semiconductor substrate 10, in the intermediate region 3. Thus, in the entire periphery of the intermediate region 3, a portion of the insulating layer 60 between the front surface of the semiconductor substrate 10 and the gate polysilicon wiring layer 62 is relatively thinner at an inner portion. The gate polysilicon wiring layer 62 faces the longitudinal ends of the gate trenches 37 in the depth direction Z and is connected to the gate electrodes 39 at the longitudinal ends of the gate trenches 37.

The gate metal wiring layer 63 is in contact with the gate polysilicon wiring layer 62, via the contact holes 40*c* of the interlayer insulating film 40. The gate electrodes 39 and the gate pad 65 are connected via the gate resistor 66 and the gate runner 67 configured by the gate polysilicon wiring layer 62 and the gate metal wiring layer 63. The gate pad 65, for example, has a stacked structure similar to that of the gate runner 67 and is formed by sequentially stacking the gate polysilicon wiring layer 68*a* and the gate metal wiring layer 69 in the order state on the insulating layer 60. The gate pad 65 is disposed closer to the chip end than is the gate runner 67 (refer to FIG. 2B).

The gate pad 65 is disposed closer to the chip center than is the drop 14 of the front surface of the semiconductor substrate 10. In other words, a cross-section of the structure along cutting line D-D' in FIG. 2B is the same as a cross-section of the structure from the active region 1 to the gate metal wiring layer 63 in FIG. 3 (cross-section of the structure along cutting line A-A' FIG. 2A). A cross-section of the structure along cutting line E-E' in FIG. 2B is the same as the cross-section of the structure from the active region 1 to the gate metal wiring layer 63 in FIG. 4 (cross-section of the structure along in cutting line B-B' FIG. 2A). A cross-section of the structure along cutting line F-F' in FIG. 2B is the same as the cross-section of the structure from the active region 1 to the gate metal wiring layer 63 in FIG. 5 (cross-section of the structure along cutting line C-C' in FIG. 2A).

Further, as described above, in the gate polysilicon wiring layer 62, in portions thereof respectively facing the gate pad 65 and the gate resistance measuring electrode pad in a direction parallel to the semiconductor substrate 10, similar to the corner portions 1*a* of the active region 1, the part 1*b* where the inner corner forms substantially a right angle (refer to FIG. 2B) is present and displacement current tends to concentrate at this location as well. Thus, at the part 1*b* where the inner corner of the gate polysilicon wiring layer 62 forms substantially a right angle, the distance w1 from the drop 64 of the surface of the insulating layer 60 to the contact holes 40*a*, 40*b* of the active region 1 may set to be in a range of 21 μm or less, whereby concentration of displacement current is suppressed.

In a portion where the gate polysilicon wiring layer 62 faces the gate pad 65 in a direction parallel to the semiconductor substrate 10, the distance w1 from the drop 64 of the surface of the insulating layer 60 to the contact holes 40*a*, 40*b* of the active region 1 is a distance w21, w22, w23 from the inner peripheral end 61*a* of a portion of the field oxide film 61 directly beneath the gate pad 65 to the contact holes 40a, 40b of the active region 1 (refer to FIG. 2B). The distances w21 to w23, for example, as described above, are set, respectively, to about the same distances as those of the distances w11 to w13 from the inner peripheral end 61a of the other portion of the field oxide film 61 to the contact holes 40a, 40b of the active region 1. Substantially the same distances means the same lengths within a range that includes an allowable error due to process variation.

The distance w21 is a distance, in the first direction X, from the inner peripheral end 61a of a portion of the field oxide film 61 directly beneath the gate pad 65 to the shortest ends of the contact holes 40a, 40b of the active region 1 in the longitudinal direction. The distance w22 is the shortest distance from the inner peripheral end 61a of a portion of the field oxide film 61 directly beneath the gate pad 65, in the second direction Y inward to the outer sidewall of the adjacent one of the contact holes 40b. The gate polysilicon wiring layer 62 curves inwardly along the gate pad 65, whereby the distance w23, in the part 1b where the corner at an inner side thereof forms substantially a right angle, is the shortest distance from the inner peripheral end 61a of the field oxide film 61 to the longitudinal end of the outermost contact hole 40b of the active region 1 in a direction oblique to the first and second directions X, Y.

The gate polysilicon wiring layer 62, in a portion facing the gate resistance measuring electrode pad in a direction parallel to the semiconductor substrate 10, the distance w1 from the drop 64 of the surface of the insulating layer 60 to the contact holes 40a, 40b of the active region 1 is a distance (not depicted) from the inner peripheral end 61a of a portion of the field oxide film 61 directly beneath the gate resistance measuring electrode pad to the contact holes 40a, 40b of the active region 1. The distance from the inner peripheral end 61a of the portion of the field oxide film 61 directly beneath the gate resistance measuring electrode pad to the contact holes 40a, 40b of the active region 1 is a distance for which the gate pad 65 in the description of the distances w21 to w23 above is replaced with the gate resistance measuring electrode pad.

In the edge termination region 2, in a surface region of the n⁻-type epitaxial layer 12 forming the second portion 10b of the front surface of the semiconductor substrate 10, the p⁻-type regions 21 and the p⁻⁻⁻-type regions 22 configuring the spatial modulation FLR structure 20 are each selectively provided, and the n⁺-type channel stopper region 23 is selectively provided away from and closer to the chip end than is the FLR structure 20. Without providing a field plate (FP), an entire area of the second portion 10b of the front surface of the semiconductor substrate 10 is covered by the insulating layer 60. The spatial modulation FLR structure 20 is a voltage withstanding structure in which a p-type impurity per unit volume decreases stepwise in a direction to the chip end.

In particular, the p⁻-type regions 21 are disposed apart from one another and surround the periphery of the active region 1 in concentric shapes. In the direction to the chip end, the p⁻-type regions 21 are disposed in descending order of width (width in the direction of the normal) and in ascending order of the intervals between any one of the p⁻-type regions 21 and an adjacent one of the p⁻-type regions 21 relatively closer to the chip center. An innermost one of the p⁻⁻⁻-type regions 22 surrounds the peripheries of all the p⁻-type regions 21 and is disposed between all the p⁻-type regions 21 that are adjacent to one another. An innermost one of the p⁻-type regions 21 and the innermost one of the p⁻⁻⁻-type regions 22 are adjacent to the p⁺-type extension portion 52a in the direction of the normal and are electrically connected to the p-type base extension portion 34a via the p⁺-type region 24 and the p⁺-type extension portion 52a or are directly connected to the p-type base extension portion 34a.

The p⁻⁻⁻-type regions 22 are disposed apart from one another and surround the periphery of the active region 1 in concentric shapes. The p⁻⁻⁻-type regions 22 are disposed in descending order of width (width in the direction of the normal) and in ascending order of the intervals between any one of the p⁻⁻⁻-type regions 22 and an adjacent one of the p⁻⁻⁻-type regions 22 relatively closer to the chip center. The p⁻⁻⁻-type regions 22, excluding the innermost one of the p⁻⁻⁻-type regions 22, are disposed closer to the chip end than are the p⁻-type regions 21. The n⁻-type drift region 32 surrounds the peripheries of all the p⁻⁻⁻-type regions 22 and is disposed between all the p⁻⁻⁻-type regions 22 that are adjacent to one another. The outermost one of the p⁻⁻⁻-type regions 22 faces the n⁺-type channel stopper region 23 in the direction of the normal, with the n⁻-type drift region 32 intervening therebetween.

The p⁻-type regions 21 and the p⁻⁻⁻-type regions 22 distribute a point of electric field concentration to multiple locations and thereby bear the high voltage applied to the edge termination region 2 when the MOSFET is off and ensure a predetermined breakdown voltage of the edge termination region 2. The n⁺-type channel stopper region 23 is provided apart from the FLR structure 20 and is closer to the chip end than is the FLR structure 20. The n⁺-type channel stopper region 23 is exposed at the end of the semiconductor substrate 10. The n⁺-type channel stopper region 23 has a function of suppressing a depletion layer that spreads in the n⁻-type drift region 32, from the active region 1 to the chip when the MOSFET is off. A channel stopper electrode (not depicted) is not provided. The channel stopper region 23 may have a p⁺-type conductivity type.

The source electrode 41 is in ohmic contact with the front surface of the semiconductor substrate 10 in the contact holes 40a, 40b and is electrically connected to the p-type base regions 34, the n⁺-type source regions 35, the p⁺⁺-type contact regions 36, the p-type base extension portion 34a, and the p⁺⁺-type contact extension part 36a. The source electrode 41 extends outward on the interlayer insulating film 40 and may terminate at a position facing the gate polysilicon wiring layer 62 in the depth direction Z. In the active region 1, a barrier metal (not depicted) may be provided between the source electrode 41 and the interlayer insulating film 40; the barrier metal prevents interaction between the source electrode 41 and the interlayer insulating film 40 and the layer therebelow.

The passivation film 42 covers an entire area of the front surface of the semiconductor substrate 10. In different openings of the passivation film 42, the source electrode 41 and the gate pad 65 are exposed, respectively. The passivation film 42, for example, is a polyimide film. In the edge termination region 2, the n⁻-type epitaxial layer suffices to be exposed at the front surface of the semiconductor substrate 10 and the front surface of the semiconductor substrate 10 may be a flat surface free of the drop 14, from the active region 1 to the chip end. The drain electrode (second electrode) 43 is in ohmic contact with an entire area of the back surface (back surface of the n⁺-type starting substrate 11) of the semiconductor substrate 10.

Operation of the silicon carbide semiconductor device 30 (SiC-MOSFET) according to the embodiment is described. When voltage (forward voltage) that is positive with respect to the source electrode 41 is applied to the drain electrode 43 and voltage at least equal to a gate threshold voltage is applied to the gate electrodes 39, a channel (n-type inversion layer) is formed in portions of the p-type base regions 34 along the gate trenches 37. As a result, current (drift current) flows from the n$^+$-type drain region 31, through the channel and to the n$^+$-type source regions 35, whereby the MOSFET turns on.

On the other hand, when forward voltage is applied between the source and drain, and voltage that is less than the gate threshold voltage is applied to the gate electrodes 39, in the active region 1, pn junctions (main junctions) between the first and second p$^+$-type regions 51, 52, the p-type base regions 34, the n-type current spreading regions 33, and the n$^-$-type drift region 32 are reverse biased, whereby the current stops flowing and thus, MOSFET maintains the off state. At this time, the pn junctions are reverse biased, whereby a depletion layer spreads from the pn junctions and a predetermined breakdown voltage of the active region 1 is ensured.

Further, when the MOSFET is off, the depletion layer that spreads from the described pn junctions of the active region 1 spreads outward (to the chip end) in the direction of the normal in the edge termination region 2 by pn junctions between the p$^{--}$-type regions 22 of the edge termination region 2 and the n$^-$-type drift region 32. By the amount that the depletion layer spreads outward in the direction of normal in the edge termination region 2, the predetermined breakdown voltage based on the depletion layer width and the breakdown field strength of silicon carbide may be ensured. Further, electric field of the edge termination region 2 is distributed by the FLR structure 20, whereby the breakdown voltage of the edge termination region 2 may enhanced.

Further, due to a steep dV/dt (voltage variation between the drain and source per unit time) occurring during the switching transition period from on to off of the MOSFET, displacement current (hole current) occurs in the n$^-$-type drift region 32 of the edge termination region 2 and flows to the active region 1. The displacement current flows from the n$^-$-type drift region 32 of the edge termination region 2, through the p$^+$-type extension portion 52a and the p-type base extension portion 34a, enters the p$^{++}$-type contact extension part 36a, and is pulled out from the contact holes 40a, 40b of the active region 1 to the source electrode 41.

At this time, as the temperature of the semiconductor substrate 10 decreases, the carriers in the semiconductor substrate 10 decrease and by the amount of carrier decrease, the resistance of the p$^{++}$-type contact extension part 36a increases (refer to FIG. 12), the period of pulling out the displacement current to the source electrode 41 becomes longer, and the potential in the front side of the semiconductor substrate 10 of the intermediate region 3 increases. Further, as the dV/dt increases, the displacement current increases, whereby the potential of the p$^{++}$-type contact extension part 36a, which occupies a large percentage of the path length of the displacement current, increases. In the present embodiment, dielectric breakdown of the insulating layer 60 due to these potential increases may be suppressed.

One reason is that the distance w1 from the drop 64 of the surface of the insulating layer 60 to the contact holes 40a, 40b of the active region 1 is set to be in a range of about 21 μm or less in the entire outer periphery of the active region 1, whereby voltage drops in the p-type regions (the p$^{++}$-type contact extension part 36a, the p-type base extension portion 34a, and the p$^+$-type extension portion 52a) of the intermediate region 3 become smaller and the strength of the electric field applied to the insulating layer 6 decreases. As a result, in the outer periphery of the active region 1, particularly in the corner portions 1a of the active region 1 where the displacement current tends to concentrate (refer to FIG. 1), the occurrence of gate leakage current is suppressed and dielectric breakdown of the insulating layer 60 (the gate insulating film 38) may be prevented.

Figure 9:
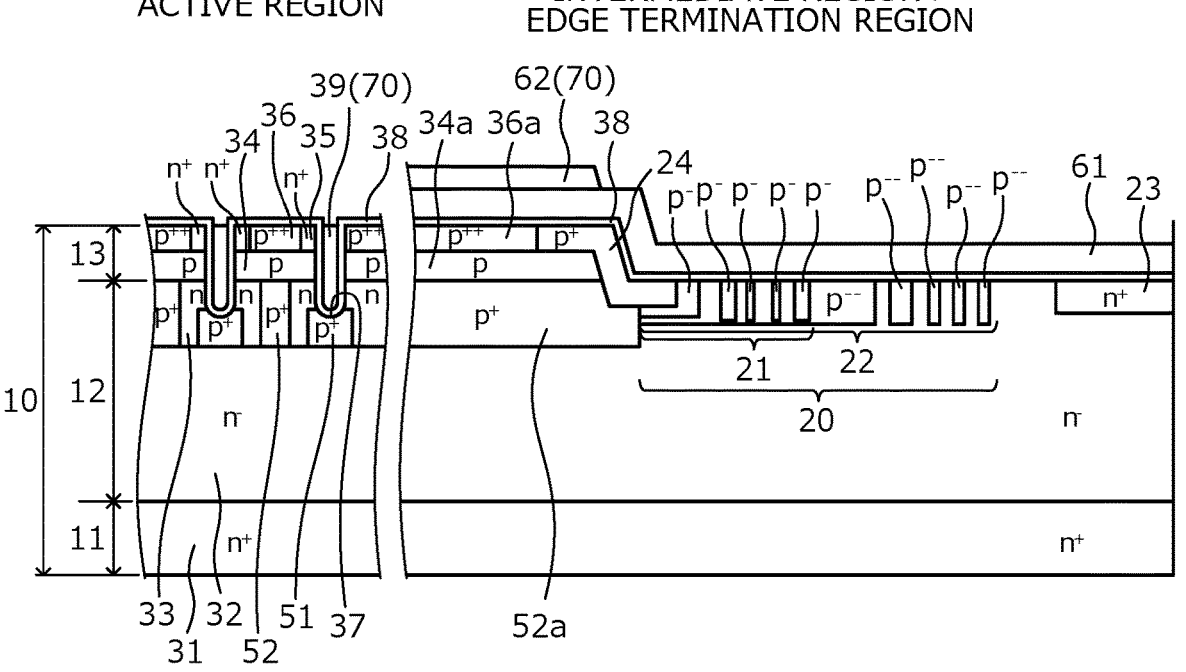
FIG. 9 is a cross-sectional view depicting a state of the silicon carbide semiconductor device according to the embodiment during manufacture.
Figure 10:
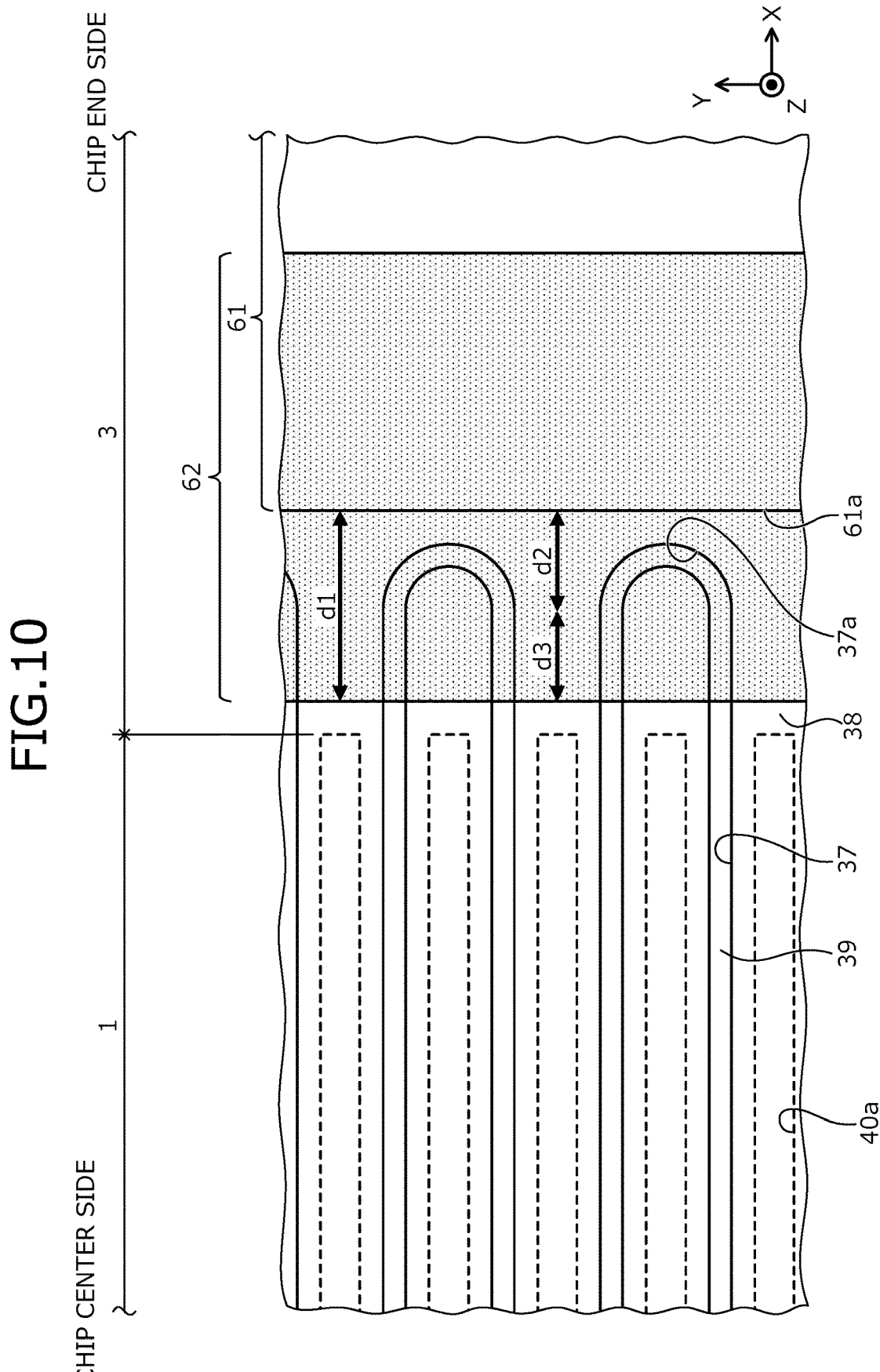
FIG. 10 is a plan view when a portion of a state of the silicon carbide semiconductor device according to the embodiment during manufacture is viewed from the front side of the semiconductor substrate.

Next, a method of manufacturing the silicon carbide semiconductor device 30 according to the embodiment is described with reference to FIGS. 1, 2A, 2B, 3 to 9. FIGS. 6, 7, 8, and 9 are cross-sectional views depicting states of the silicon carbide semiconductor device according to the embodiment during manufacture. FIG. 10 is a plan view of a state of the silicon carbide semiconductor device according to the embodiment during manufacture, when a portion thereof is viewed from the front side of the semiconductor substrate. FIG. 10 depicts an enlarged view of a vicinity of the border between the active region 1 and the intermediate region 3. In FIG. 10, positions of the contact holes 40a of the active region 1 are indicated by dashed lines and depiction of the gate insulating film 38 in the gate trenches 37 is omitted.

First, the n$^+$-type starting substrate (starting wafer) 11 containing silicon carbide is prepared. Next, on the front surface of the n$^+$-type starting substrate 11, the n$^-$-type epitaxial layer 12 constituting the n$^-$-type drift region 32 is epitaxially grown. Next, the first p$^+$-type regions 51 and lower portions of the second p$^+$-type regions 52 (portions facing the n$^+$-type drain region 31) are each selectively formed in surface regions of the n$^-$-type epitaxial layer 1, in the active region 1, by photolithography and ion implantation of a p-type impurity such as aluminum (Al). At this time, concurrently with the lower portions of the second p$^+$-type regions 52, a lower portion of the p$^+$-type extension portion 52a is formed in the intermediate region 3.

Further, lower portions of the n-type current spreading regions 33 are formed in surface regions of the n$^-$-type epitaxial layer 12 in the active region 1 by photolithography and ion implantation of an n-type impurity. At this time, a lower portion of the n-type current spreading extension portion 33a is formed in the intermediate region 3 concurrently with the lower portions of the n-type current spreading regions 33 while in the active region 1 and the intermediate region 3, a portion of the n$^-$-type epitaxial layer 12 left having the impurity concentration as is free of ion implantation and closer to the n$^+$-type starting substrate 11 than are the first and second p$^+$-type regions 51, 52, the p$^+$-type extension portion 52a, the n-type current spreading regions 33, and the n-type current spreading extension portion 33a, constitutes the n$^-$-type drift region 32.

Next, the thickness of the n$^-$-type epitaxial layer 12 is increased to a predetermined thickness by further performing epitaxial growth. Next, in the portion by which the thickness of the n$^-$-type epitaxial layer 12 is increased, upper portions (portions facing the n$^+$-type source regions 35) of the second p$^+$-type regions 52 are selectively formed by photolithography and ion implantation of a p-type impurity such as aluminum, so as to be adjacent to the lower portions of the second p$^+$-type regions 52 in the depth direction Z. Further, in the portion by which the thickness of the n$^-$-type epitaxial layer 12 is increased, upper portions of the n-type current spreading regions 33 are formed by photolithography and ion implantation of an n-type impurity, so as to be adjacent to the lower portions of the n-type current spreading regions 33 in the depth direction Z.

At this time, concurrently with the upper portions of the second p$^+$-type regions 52, an upper portion of the p$^+$-type extension portion 52a is formed so as to be adjacent to the lower portion of the p$^+$-type extension portion 52a in the depth direction Z. Concurrently with the upper portions of the n-type current spreading regions 33, an upper portion of the n-type current spreading extension portion 33a is formed so as to be adjacent to the lower portion of the n-type current spreading extension portion 33a in the depth direction Z. Of the n$^-$-type epitaxial layer 12, in the portion formed by the initial epitaxial growth and in the portion that increases the thickness, the upper portions and the lower portions formed so as to be adjacent to one another in the depth direction Z are connected to one another, thereby forming the second p$^+$-type regions 52, the n-type current spreading regions 33, the p$^+$-type extension portion 52a, and the n-type current spreading extension portion 33a.

Next, on the n$^-$-type epitaxial layer 12, the p-type epitaxial layer 13 is epitaxially grown. By the processes up to here, the semiconductor substrate (semiconductor wafer) 10 in which the epitaxial layers 12, 13 are sequentially stacked, in the order stated, on the n$^+$-type starting substrate 11 is completed. Next, a portion of the p-type epitaxial layer 13 in the edge termination region 2 is removed by etching, thereby forming at the front surface of the semiconductor substrate 10, the drop 14 where a portion of the front surface (the second portion 10b) in the edge termination region 2 is lower than a portion (the first portion 10a) of the front surface in the active region 1 and the intermediate region 3. At the newly formed second portion 10b of the front surface of the semiconductor substrate 10, the n$^-$-type epitaxial layer 12 is exposed.

The third portion 10c that connects the first portion 10a and the second portion 10b of the front surface of the semiconductor substrate 10, for example, may form an obtuse angle (sloped surface) with respect to the first and second portions 10a, 10b or may form substantially a right angle (orthogonal surface). At the third portion 10c of the front surface of the semiconductor substrate 10, the side surface of the p-type epitaxial layer 13 is exposed. By the etching that removes this portion of the p-type epitaxial layer 13 in the edge termination region 2 and thereby newly forms the second portion 10b of the front surface of the semiconductor substrate 10 and exposes the n$^-$-type epitaxial layer 12, the p-type epitaxial layer 13 and surface regions of the n$^-$-type epitaxial layer 12 are slightly removed.

Next, photolithography and ion implantation are repeatedly performed under predetermined conditions thereby selectively forming the n$^+$-type source regions 35 and the p$^{++}$-type contact regions 36 in surface regions of the p-type epitaxial layer 13. The p-type impurity ion-implanted to form the p$^{++}$-type contact regions 36 is, for example, aluminum (Al). At this time, concurrently with the p$^{++}$-type contact regions 36, the p$^{++}$-type contact extension part 36a may be formed. Portions of the p-type epitaxial layer 13 left having the impurity concentration as is free of ion implantation and closer to the n$^+$-type starting substrate 11 than are the n$^+$-type source regions 35, the p$^{++}$-type contact regions 36, and the p$^{++}$-type contact extension part 36a, constitute the p-type base regions 34 and the p-type base extension portion 34a.

Further, photolithography and ion implantation are repeatedly performed under predetermined conditions, thereby selectively forming in the edge termination region 2, the p$^-$-type regions 21 and the p$^{---}$-type regions 22 configuring the spatial modulation FLR structure 20, and the n$^+$-type channel stopper region 23 in the n$^-$-type epitaxial layer 12 at surface regions thereof exposed at the second portion 10b of the front surface of the semiconductor substrate 10. In the intermediate region 3, the p$^+$-type region 24 may be formed in a surface region of the semiconductor substrate 10, at the third portion 10c of the front surface of the semiconductor substrate 10. A portion of the n$^-$-type epitaxial layer 12 in the edge termination region 2 left having the impurity concentration as is free of ion implantation and closer to the n$^+$-type starting substrate 11 than are the p$^-$-type regions 21, the p$^{---}$-type regions 22, and the n$^+$-type channel stopper region 23, constitutes the n$^-$-type drift region 32.

Next, a heat treatment (activation annealing) for activating the impurities ion-implanted in the epitaxial layers 12, 13 is performed. The activation annealing may be performed one time collectively for all the ion-implanted diffused regions (the n-type current spreading regions 33, the n-type current spreading extension portion 33a, the first and second p$^+$-type regions 51, 52, the p$^+$-type extension portion 52a, the n$^+$-type source regions 35, the p$^{++}$-type contact regions 36, the p$^{++}$-type contact extension part 36a, the p$^-$-type regions 21, the p$^{---}$-type regions 22, the n$^+$-type channel stopper region 23, and the p$^+$-type region 24) or may be performed each time diffusion regions are formed by ion implantation.

Figure 6:
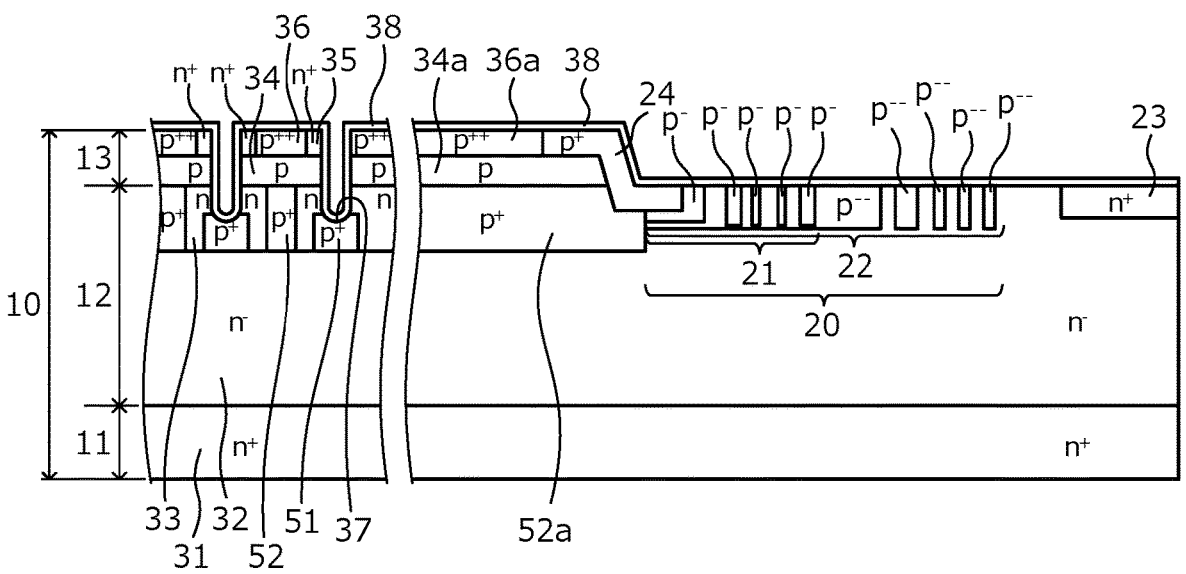
FIG. 6 is a cross-sectional view depicting a state of the silicon carbide semiconductor device according to the embodiment during manufacture.

Next, as depicted in FIG. 6, the gate trenches 37 that penetrate through the n$^+$-type source regions 35 and the p-type base regions 34 from the front surface of the semiconductor substrate 10 and terminate in the n-type current spreading regions 33 and face the first p$^+$-type regions 51 in the depth direction Z are formed by photolithography and etching. The gate trenches 37 are formed in plural in a striped pattern extending in the first direction X. The longitudinal ends of the gate trenches 37 terminate in the intermediate region 3 (refer to FIG. 10). Next, the gate insulating film 38 is formed along an entire area of the front surface of the semiconductor substrate 10 and the inner walls (sidewalls and bottoms) of the gate trenches 37.

Figure 7:
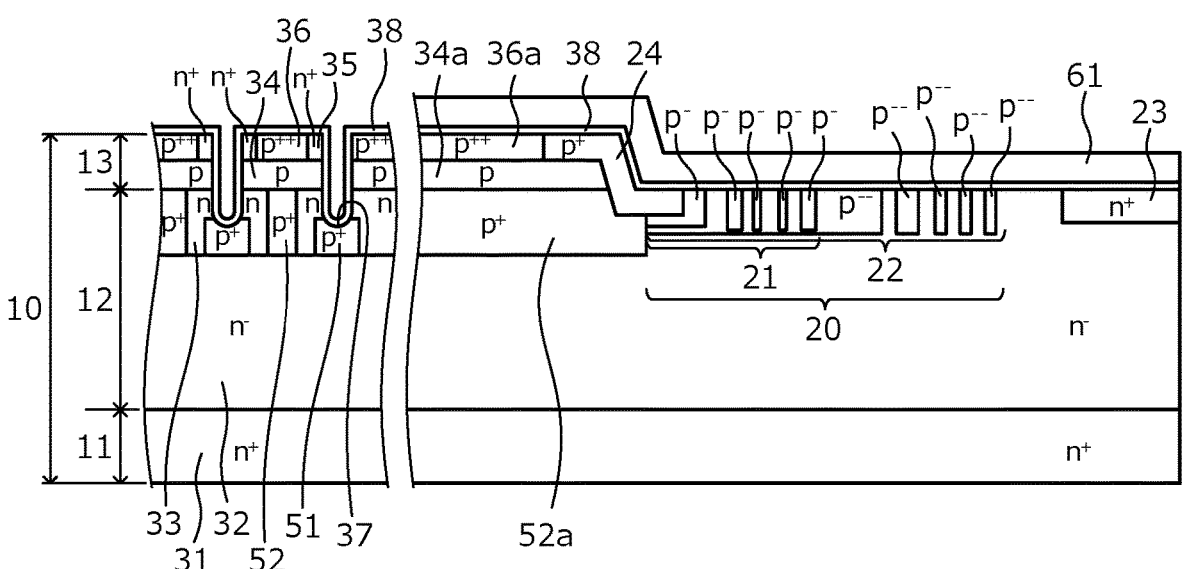
FIG. 7 is a cross-sectional view depicting a state of the silicon carbide semiconductor device according to the embodiment during manufacture.

Next, as depicted in FIG. 7, the field oxide film 61 is deposited on the gate insulating film 38 of the front surface of the semiconductor substrate 10, thereby forming the insulating layer 60 in which the gate insulating film 38 and the field oxide film 61 are sequentially stacked in the order state. Next, by photolithography and for example, wet etching, a portion of the field oxide film 61 in the active region 1 is removed, leaving only portions in the intermediate region 3 and the edge termination region 2. As a result, at the surface of the insulating layer 60, the drop 64 is formed due to the difference in thickness of the relatively thick portion where the gate insulating film 38 and the field oxide film 61 are stacked and the relatively thin portion formed by only the gate insulating film 38 (refer to FIGS. 3 to 5).

Further, the field oxide film 61 is disposed so that at least a portion of the gate trenches 37 is not covered. For example, all of the ends of the gate trenches 37 are not covered by the field oxide film 61 (refer to FIG. 10) or among the ends of the gate trenches 37, only connecting portions 37a that connect the ends of the gate trenches 37 that are adjacent to each other are covered by the field oxide film 61. Further, as described above, the distance w1 from the inner peripheral end 61a of the field oxide film 61 to the contact holes 40a, 40b formed by a subsequent process is in a range of about 21 μm or less.

Figure 8:
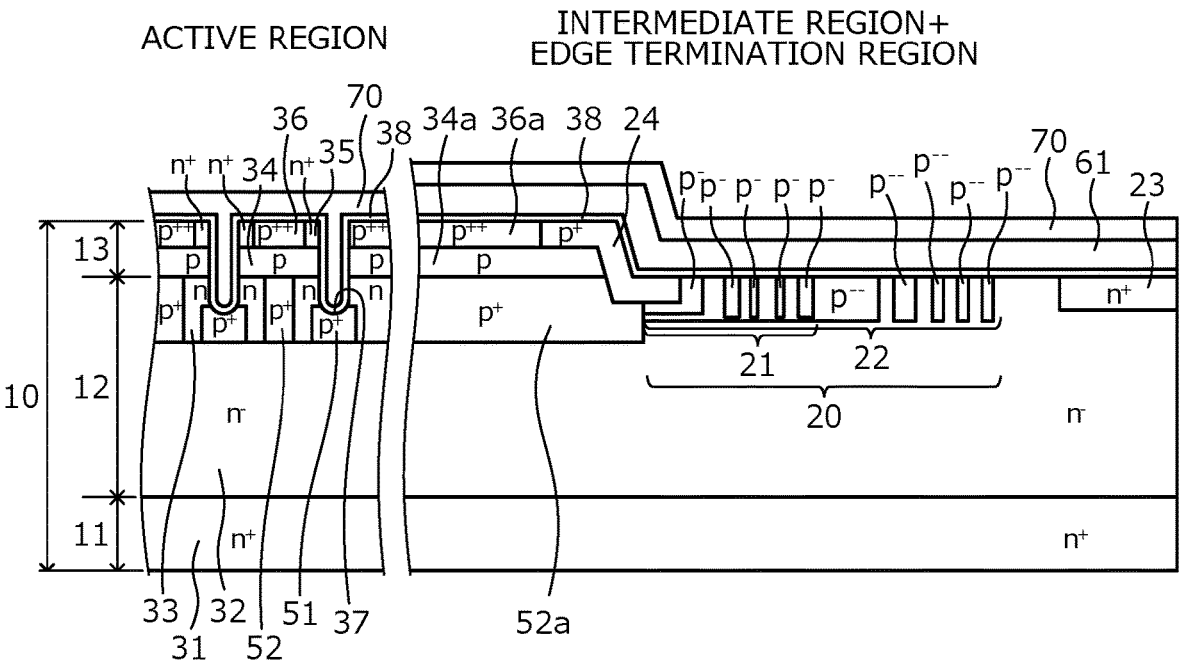
FIG. 8 is a cross-sectional view depicting a state of the silicon carbide semiconductor device according to the embodiment during manufacture.

Next, as depicted in FIG. 8, a polysilicon layer 70 is deposited in an entire area of the front surface of the semiconductor substrate 10 so as to be embedded in the gate trenches 37. Next, as depicted in FIG. 9, by photolithography and etching, the polysilicon layer 70 is selectively removed leaving portions of the polysilicon layer 70 constituting the gate electrodes 39 in the gate trenches 37 and leaving at the uppermost surface of the front surface of the semiconductor substrate 10, a portion constituting the gate polysilicon wiring layer 62 of the gate runner 67, a portion constituting the gate polysilicon wiring layer 68a configuring the gate pad 65, and a portion constituting the gate polysilicon wiring layer 68b configuring the gate resistor 66. At this time, the gate polysilicon wiring layer 62 is left so as to cover the longitudinal ends of the gate trenches 37.

When the polysilicon layer 70 is deposited, at least a portion of the longitudinal ends of the gate trenches 37 is not covered by the field oxide film 61. For example, configuration may be such that all of the ends (portions of s length d1 in FIG. 10) of the gate trenches 37 are not covered by the field oxide film 61. Further, the inner peripheral end 61a of the field oxide film 61 extends inward for a length d2 and the connecting portions 37a having a substantially arc shape in a plan view and connecting ends of the gate trenches 37 that are adjacent to one another are covered by the field oxide film 61 while portions (portion of length d3 in FIG. 10) of the gate trenches 37 closer to the chip center than are the ends connected to the connecting portions 37a are not covered by the field oxide film 61.

As described, at least a portion of the longitudinal ends of the gate trenches 37 are not covered by the field oxide film 61, whereby by merely selectively removing the polysilicon layer 70 deposited in an entire area of the front surface of the semiconductor substrate 10 so as to be embedded in the gate trenches 37, the gate polysilicon wiring layer 62 configuring the gate runner 67 and the gate electrodes 39 may be connected to each other at the longitudinal ends of the gate trenches 37. In addition, the gate polysilicon wiring layer 62 configuring the gate runner 67 and the gate polysilicon wiring layer 68a configuring the gate pad 65 may be connected to each other by the gate polysilicon wiring layer 68b configuring the gate resistor 66 (refer to FIG. 2B).

In other words, the inner peripheral end 61a of the field oxide film 61 is disposed closer to the chip end than is the connecting part 62a of the gate polysilicon wiring layer 62 and the gate electrodes 39. The gate polysilicon wiring layer 62, at the connecting part 62a connected to the gate electrodes 39, faces the p$^{++}$-type contact extension part 36a in the depth direction Z with only the gate insulating film 38 intervening therebetween. For example, an instance in which the field oxide film 61 is present between the gate polysilicon wiring layer 62 and the connecting part 62a of the gate polysilicon wiring layer 62 and the gate electrodes 39 overall (in FIG. 10, the field oxide film 61 has the inner peripheral end 61a extending inward for the length d1) may be assumed.

In this instance, to connect the gate polysilicon wiring layer 62 and the gate electrodes 39, contact holes that penetrate through the field oxide film 61 in the depth direction Z are formed. Nonetheless, as described above, a portion of the field oxide film 61 in the active region 1 is removed by wet etching and thus, concurrently with the removal of the portion of the field oxide film 61 in the active region 1, formation of contact holes having a narrow width in the field oxide film 61 by the wet etching is difficult in terms of process. Further, a different problem arises in an instance in which the contact holes are formed in the field oxide film 61 by dry etching.

Therefore, so that formation of contact holes in the field oxide film 61 is unnecessary, as described above, the position of the inner peripheral end 61a of the field oxide film 61 is adjusted and at least a portion of the longitudinal ends of the gate trenches 37 suffices not to be covered by the field oxide film 61. The gate polysilicon wiring layer 62 extends passing through the drop 64 of the surface of the insulating layer 60 (refer to FIGS. 3 to 5) from on the field oxide film 61 of the insulating layer 60 and is disposed so as to face at least a portion of the longitudinal ends of the gate trenches 37 with only the gate insulating film 38 of the insulating layer 60 intervening therebetween.

Next, in an entire area of the front surface of the semiconductor substrate 10, the interlayer insulating film 40 that covers the gate electrodes 39 and the gate polysilicon wiring layers 62, 68a, 68b is formed. Next, by photolithography and etching, in the active region 1, the contact holes 40a, 40b that penetrate through the interlayer insulating film 40 and the gate insulating film 38 in the depth direction Z and reach the front surface of the semiconductor substrate 10 are formed. In the other contact holes 40a excluding the outermost contact holes 40b of the active region 1, the n$^+$-type source regions 35 and the p$^{++}$-type contact regions 36 are exposed. In the outermost contact holes 40b of the active region 1, the p$^{++}$-type contact extension part 36a is exposed.

Further, by photolithography and etching, in the intermediate region 3, the contact holes 40c that penetrate through the interlayer insulating film 40 in the depth direction Z and reach the gate polysilicon wiring layer 62, and the contact holes that reach the polysilicon wiring layer 68a are formed. Next, by a heat treatment, the interlayer insulating film 40 is planarized (reflow). Next, a metal layer is formed in an entire region of the front surface of the semiconductor substrate 10 so as to be embedded in the contact holes. Next, the metal layer is patterned, leaving portions respectively constituting the source electrode 41, the gate metal wiring layer 63 configuring the gate runner 67, and the gate metal wiring layer 69 configuring the gate pad 65.

The source electrode 41 is in ohmic contact with the front surface of the semiconductor substrate 10 in the contact holes 40a, 40b. The source electrode 41 is disposed apart from the gate metal wiring layer configuring the gate metal wiring layer 63 and the gate pad 65. The gate metal wiring layer 63 configuring the gate runner 67 is in contact with the gate polysilicon wiring layer 62 in the contact holes 40c. The gate metal wiring layer 69 configuring the gate pad 65 is in contact with the gate polysilicon wiring layer 68a in non-depicted contact holes. The gate metal wiring layers 63, 69 may be connected to each other on a polysilicon wiring layer 68b configuring the gate resistor 66.

Further, the drain electrode 43 is formed at the back surface of the semiconductor substrate 10. Next, the passivation film 42 is formed in an entire area of the front surface of the semiconductor substrate 10, the passivation film 42 covers the source electrode 41 and the gate metal wiring layer configuring the gate metal wiring layer 63 and the gate pad 65. Next, the passivation film 42 is selectively removed and in different formed openings, the source electrode 41 (the source pad) and the gate pad 65 are exposed. Thereafter, the semiconductor substrate 10 (semiconductor wafer) is diced (cut) into individual chips, whereby the MOSFET (the silicon carbide semiconductor device 30) depicted in FIGS. 1, 2A, 2B, 3 to 5 is completed.

As described above, according to the embodiment, in the intermediate region between the active region and the edge termination region, the gate polysilicon wiring layer configuring the gate runner is disposed on the front surface of the semiconductor substrate, via the insulating layer. The insulating layer is formed by sequentially stacking the gate insulating film and field oxide film in the order stated. Directly beneath the gate polysilicon wiring layer, in the semiconductor substrate, at the front surface thereof, the p$^{++}$-type contact extension portion is disposed adjacent to the insulating layer in the depth direction. Between the gate polysilicon wiring layer and the p$^{++}$-type contact extension portion, the insulating layer has a relatively thicker portion formed by the gate insulating film and the field oxide film that are stacked on each other and a relatively thinner portion that is formed by only the gate insulating film and closer to the chip center than is the relatively thicker portion and further has a drop at the surface due to this difference in thickness.

A distance from the drop of the surface of the insulating layer to the contact holes of the active region is set to a range of about 21 µm or less. As a result, when displacement current that occurs in the edge termination region during the switching transition period from on to off of the MOSFET passes through the p-type regions (the p$^+$-type extension portion, the p-type base extension portion, and the p$^{++}$-type contact extension portion) of the intermediate region, from the contact holes of the active region and is pulled out to the source electrode, voltage drops of the p-type regions of the intermediate region may be made smaller. As a result, the strength of the electric field applied to the insulating layer between the gate polysilicon wiring layer and the p-type regions of the intermediate region may be reduced and thus, even when the insulating layer has a relatively thin portion formed by only the gate insulating film, degradation of the gate insulating film by the displacement current in the relatively thinner portion may be suppressed and dielectric breakdown of the insulating layer may be suppressed.

Further, carriers in the semiconductor substrate decrease the lower is the temperature of the semiconductor substrate, the resistance of the p$^{++}$-type contact extension portion increases by the amount the carrier decrease, and the potential of the front side of the semiconductor substrate in the intermediate region due to the displacement current increases. In the conventional structure (refer to FIGS. 13 to 15), when the MOSFET is operated under a subzero temperature environment, due to a rise in the potential of the front side of the semiconductor substrate in the intermediate region, the insulating layer dielectrically breaks down, however, according to the embodiment, as described above, voltage drop of the p-type regions of the intermediate region are small and thus, even when the MOSFET is operated under a subzero temperature environment, a rise in the potential of the front side of the semiconductor substrate in the intermediate region may be suppressed and dielectric breakdown of the insulating layer does not occur. Thus, compared to the conventional structure, an applicable temperature range of the operating environment of the MOSFET is wide and a highly reliable semiconductor device may be provided.

Figure 11:
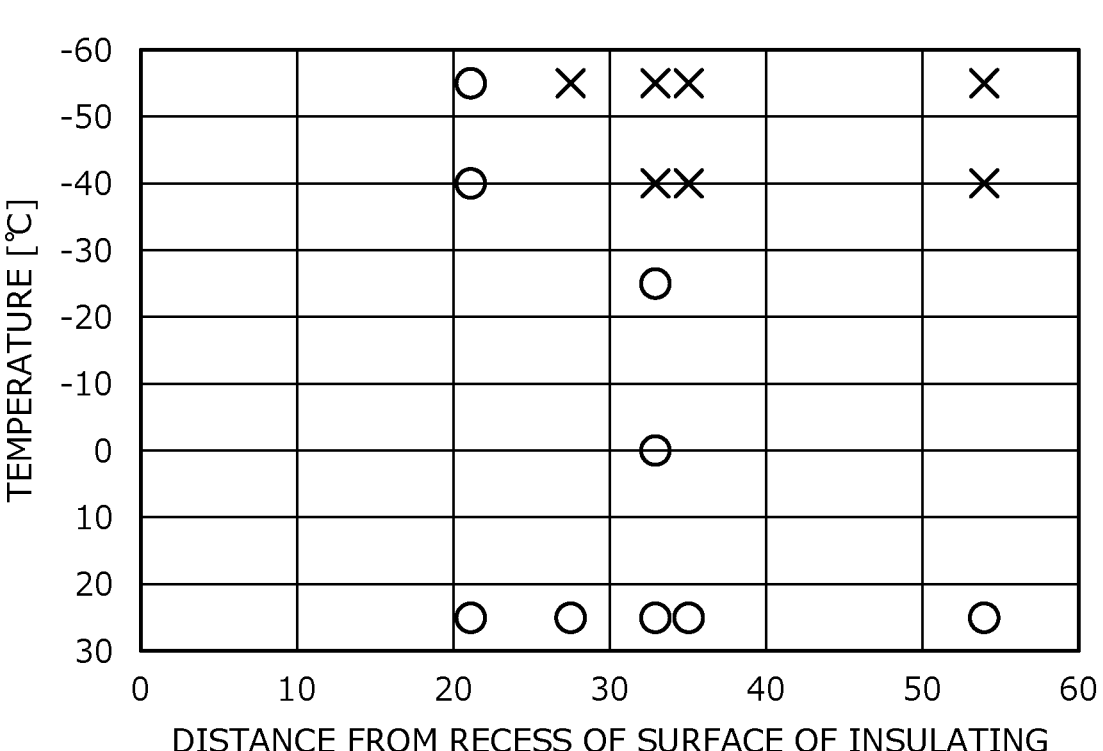
FIG. 11 is a characteristics diagram depicting operating environment temperature dependence of a distance from a drop of a surface of an insulating layer to contact holes of a first experimental example.

The distance w1 from the drop 64 of the surface of the insulating layer 60 to the contact holes 40a, 40b of the active region 1 was verified. FIG. 11 is a characteristics diagram depicting operating environment temperature dependence of the distance from the drop of the surface of the insulating layer to the contact holes of a first experimental example. In FIG. 11, a horizontal axis indicates the distance w1 from the drop 64 of the surface of the insulating layer 60 to the contact holes 40a, 40b of the active region 1 (in FIG. 11, the distance from the drop of the surface of the insulating layer to the contact hole is depicted). In FIG. 11, a vertical axis indicates the temperature of the semiconductor substrate 10 during operation for the first experimental example. The temperature of the semiconductor substrate 10 in the initial operating period of the first experimental example is in thermal equilibrium with the temperature of experimental environment of the first experimental example.

As the first experimental example, multiple samples were prepared each having a different distance (in particular, 21 µm, 27.5 µm, 33 µm, 35 µm, and 54 µm) from the drop of the surface of the insulating layer between the front surface of the semiconductor substrate in the intermediate region and the gate polysilicon wiring layer, to the contact holes of the active region. Of the samples of the first experimental example, a sample in which the distance w1 from the drop 64 of the surface of the insulating layer 60 to the contact holes 40a, 40b of the active region 1 was 21 µm corresponds to the silicon carbide semiconductor device 30 according to the embodiment (refer to FIGS. 1, 2A, 2B, 3 to 5) while the other samples correspond to a silicon carbide semiconductor device 230 as a comparison example (refer to FIGS. 13 to 15).

With respect to the samples of the first experimental example, under multiple temperature environments (evaluation temperature), during the switching transition period from on to off, dV/dt (variation of voltage between the drain and source per unit time) was induced by a maximum load 20 kV/µs assumed under normal operation of the MOSFET and results of whether dielectric breakdown occurs are shown in FIG. 11. Evaluation temperatures (=temperatures of the semiconductor substrates 10, 210) of the first experimental example were −55 degrees C., −40 degrees C., −25 degrees C., 0 degrees C., and 25 degrees C. (room temperature). In FIG. 11, a sample that dielectrically broke down by a single occurrence of dV/dt is indicated as "dielectric breakdown occurred (x mark)", a sample that did not dielectrically breakdown by a single occurrence of dV/dt is indicated as "dielectric breakdown did not occur (○ mark)".

From the results shown in FIG. 11, it was confirmed that in the first experimental example, for the samples in which the distance w1 from the drop 64 of the surface of the insulating layer 60 to the contact holes 40a, 40b of the active region 1 was 21 µm, for all evaluation temperatures (initial temperature of the semiconductor substrate 10), no dielectric breakdown of the insulating layer 60 occurred. On the other hand, for the other samples in which the distance w201 from the drop 264 of the surface of the insulating layer 260 to the contact holes 240a, 240b of the active region 201 was more than 21 µm, it was confirmed that as the evaluation temperature (initial temperature of the semiconductor substrate 210) decreased, the insulating layer 260 dielectrically broke down before a temperature rise of the semiconductor substrate 210 due to device operation.

One reason is that as the evaluation temperature decreased, the carriers in the semiconductor substrates 10, 210 decreased and the resistance of the p$^{++}$-type contact extension parts 36a, 236a increased by the amount that the carriers decreased, however, by setting the distance w1 from the drop 64 of the surface of the insulating layer 60 to the contact holes 40a, 40b of the active region 1 to 21 µm or less, as compared to the other samples, the period of time that displacement current occurring in the edge termination region 2 due to dV/dt during the switching transition period from on to off of the MOSFET is pulled out to the source electrode 41 from the contact holes 40a, 40b of the active region 1 is shortened and the strength of electric field applied to the insulating layer 60 decreases.

Figure 12:
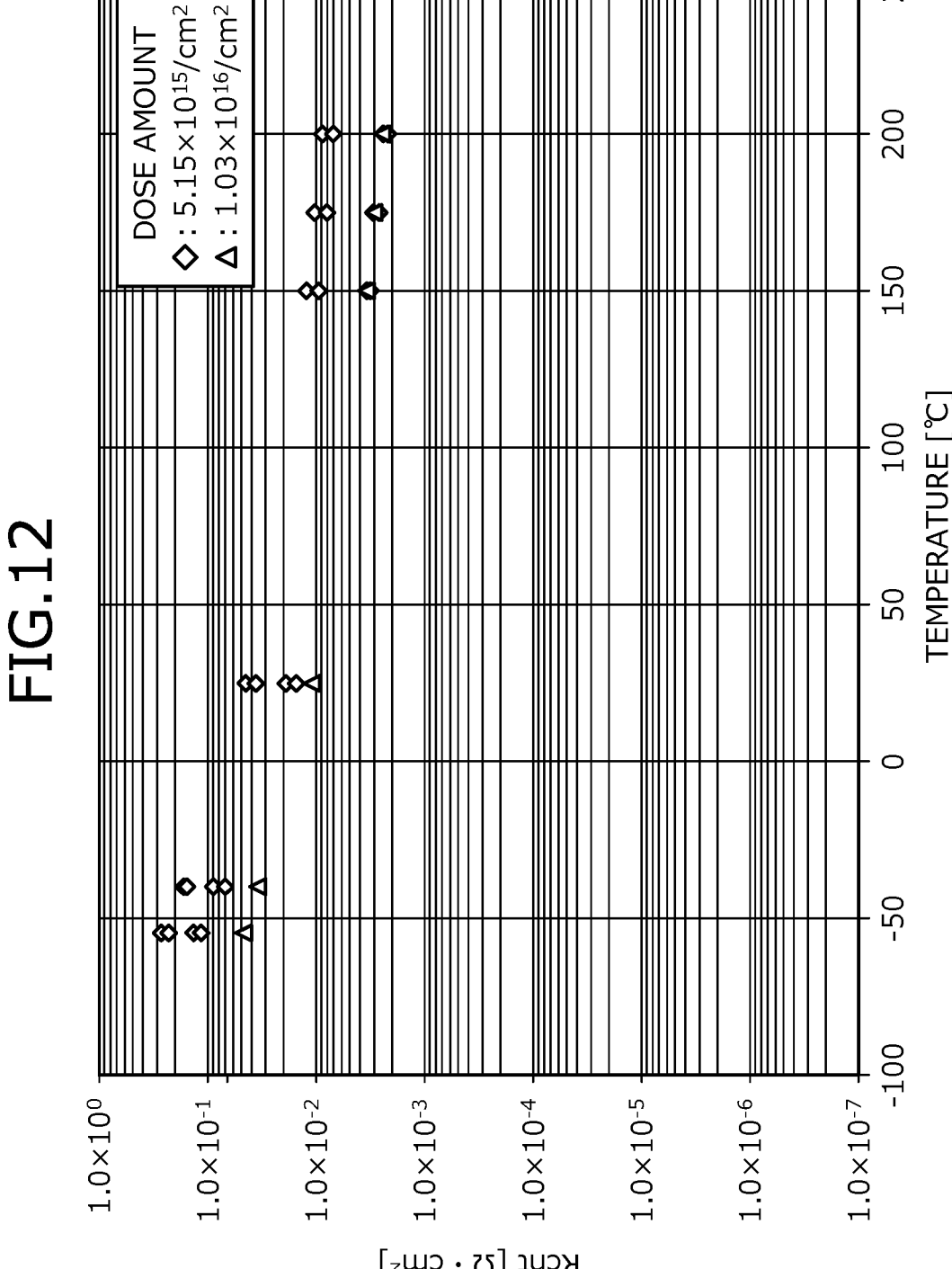
FIG. 12 is a characteristics diagram depicting temperature dependence of a resistance value of p-type regions of a second example.

Temperature dependence of the resistance value of the p$^{++}$-type contact extension part 36a was verified. FIG. 12 is a characteristics diagram depicting temperature dependence of the resistance value of the p-type regions of a second example. With respect to the silicon carbide semiconductor device 30 described above according to the embodiment (refer to FIGS. 1, 2A, 2B, 3 to 5) (hereinafter, second experimental example), under a −50 degree C. or less temperature environment (=initial temperature of the semiconductor substrate 10), device operation was started and each time the temperature of the semiconductor substrate 10 increased to a predetermined temperature due to device operation, the resistance value Rcnt of the p⁺⁺-type contact extension portion 36a was measured and the results are shown in FIG. 12. As samples of the second experimental example, two were prepared having different dose amounts of aluminum (Al) ion-implanted in the p-type epitaxial layer 13 to form the p⁺⁺-type contact extension part 36a.

From the results shown in FIG. 12, it was confirmed that independent of the aluminum dose amount, the lower is the temperature of the semiconductor substrate 10, the higher is the resistance value of the p⁺⁺-type contact extension portion 36a.

In the foregoing, the present invention is not limited to the described embodiments and may be variously modified within a range not departing from the spirit of the inventions. For example, even in an instance in which a gate finger having the same structure as that of the gate runner is disposed in the active region and the gate pad and the gate electrodes are electrically connected via the gate finger, similar to the gate runner, the gate polysilicon wiring layer configuring the gate finger has a portion disposed on the front surface of the semiconductor substrate via only the gate insulating film and thus, the present invention is applicable between the gate finger and the contact holes (contact holes that form ohmic contact portions (contacts) between the source electrode and the semiconductor substrate) of the active region.

Further, in an instance in which a current sensing device is disposed on a single semiconductor substrate having the MOSFET as a main semiconductor device, by a structure similar to that of the gate electrodes of the main semiconductor device, the gate electrodes of the current sensing device are connected to the gate polysilicon wiring layer that configures the gate runner. The gate polysilicon wiring layer that configures the gate runner is provided on the front surface of the semiconductor substrate, via only the gate insulating film of the current sensing device, at a portion facing the current sensing device. Thus, the present invention is applicable between the gate polysilicon wiring layer configuring the gate runner and the contact holes (second contact holes) in which a source contact (electrical contact between the source electrode and the semiconductor substrate) of the current sensing device is formed.

The present invention is applied between the gate polysilicon wiring layer configuring the gate runner and the source contact of the current sensing device, whereby dielectric breakdown of the insulating layer between the gate runner and the current sensing device may be suppressed. The current sensing device is a MOSFET having the same structure as that of the main semiconductor device, is connected in parallel to the main semiconductor device, and has a function of detecting overcurrent (OC) flowing in the main semiconductor device. The current sensing device may be disposed closer to the chip center or closer to the chip end than is the gate runner. Further, instead of the trench gate structure, the present invention is further applicable to a planar gate structure. Further, the present invention is similarly implemented when the conductivity types (n-type, p-type) are reversed.

According to the invention described above, when displacement current that occurs in a termination region during the switching transition period from on to off is pulled out through a second semiconductor region of the intermediate region, from the first contact hole of the active region to the first electrode, voltage drops in the second semiconductor region of the intermediate region may be reduced in magnitude, whereby the strength of the electric field applied to the insulating layer between the gate polysilicon wiring layer and the second semiconductor region of the intermediate region may be reduced and thus, even when a thin portion of the insulating layer is formed by only the gate insulating film, degradation of the gate insulating film at the thin portion may be suppressed.

Further, according to the invention described above, the voltage drop of the second semiconductor region of the intermediate region is reduced, whereby under a temperature environment in which the temperature of the semiconductor substrate is subzero, even when carriers in the semiconductor substrate decrease and the resistance of the second semiconductor regions of the intermediate region increases, increases in the potential at the front surface of the semiconductor substrate in the intermediate region is suppressed. As a result, between the gate polysilicon wiring layer and the second semiconductor region of the intermediate region, the strength of the electric field applied to the insulating layer between the second semiconductor region may be reduced and thus, dielectric breakdown of the insulating layer may be suppressed.

According to the silicon carbide semiconductor device of the present invention, an effect is achieved in that a silicon carbide semiconductor device that is highly reliable under operating environments of a wide temperature range may be provided.

As described above, the silicon carbide semiconductor device according to the present invention is useful for power semiconductor devices that control high voltage and/or large current.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having, on a semiconductor substrate containing silicon carbide and having a first main surface and a second main surface opposite to each other, an active region through which a main current flows, a termination region surrounding a periphery of the active region in a top view of the semiconductor device, and an intermediate region provided between the active region and the termination region in the top view of the semiconductor device, the semiconductor device comprising:

a first semiconductor region of a first conductivity type, provided in the semiconductor substrate;

a second semiconductor region of a second conductivity type, provided between the first main surface of the semiconductor substrate and the first semiconductor region, in the active region and the intermediate region;

a third semiconductor region of the first conductivity type, selectively provided in the active region, between the first main surface of the semiconductor substrate and the second semiconductor region;

a gate insulating film covering the first main surface of the semiconductor substrate and provided in contact with a region of the second semiconductor region, the region being between the first semiconductor region and the third semiconductor region;

a gate electrode provided, via the gate insulating film, on the region of the second semiconductor region between the first semiconductor region and the third semiconductor region;

a fourth semiconductor region of the second conductivity type, provided in the intermediate region, between the first main surface of the semiconductor substrate and the second semiconductor region, the fourth semiconductor region having an impurity concentration that is higher than an impurity concentration of the second semiconductor region;

a field oxide film provided in the intermediate region, on the gate insulating film on the first main surface of the semiconductor substrate;

a gate polysilicon wiring layer provided on the field oxide film and surrounding a periphery of the active region in the top view of the semiconductor device, an inner peripheral end of the gate polysilicon wiring layer being connected to the gate electrode, the gate polysilicon wiring layer facing the fourth semiconductor region in a depth direction with the field oxide film and the gate insulating film intervening therebetween;

an interlayer insulating film covering the gate electrode and the gate polysilicon wiring layer;

a first contact hole penetrating through the interlayer insulating film in the depth direction and exposing the first main surface of the semiconductor substrate;

a first electrode electrically connected to the second semiconductor region, the third semiconductor region, and the fourth semiconductor region via the first contact hole; and a second electrode provided at the second main surface of the semiconductor substrate, wherein the gate polysilicon wiring layer extends farther to the active region than is the inner peripheral end of the field oxide film, and, at an inner portion of the gate polysilicon wiring layer, faces the fourth semiconductor region in the depth direction via the gate insulating film only, and the field oxide film has an inner peripheral end that is closer to the termination region than is the first contact hole, and positioned with a distance in a range of not more than 21 μm apart from the first contact hole.

2. The semiconductor device according to claim 1, wherein the inner peripheral end of the field oxide film is positioned with a distance in a range of 5 μm to 10 μm apart from the first contact hole.

3. The semiconductor device according to claim 1, further comprising a third electrode provided at the first main surface of the semiconductor substrate and having a same potential as that of the first electrode, wherein the third electrode is electrically connected to a region in the semiconductor substrate via a second contact hole that penetrates through the interlayer insulating film in the depth direction, and the inner peripheral end of the field oxide film is positioned not more than 21 μm apart from the second contact hole.

4. The semiconductor device according to claim 1, wherein the gate electrode extends linearly in a direction parallel to the first main surface of the semiconductor substrate and reaches the intermediate region from the active region, the gate electrode having longitudinal ends connected to the gate polysilicon wiring layer.

5. The semiconductor device according to claim 1, further comprising a trench penetrating through the third semiconductor region and the second semiconductor region in the depth direction from the first main surface of the semiconductor substrate and reaching the first semiconductor region, the trench extending linearly from the active region to the intermediate region in a direction parallel to the first main surface of the semiconductor substrate, wherein the gate electrode is provided in the trench via the gate insulating film and is connected to the gate polysilicon wiring layer at longitudinal ends of the trench.

* * * * *